(12) United States Patent
Huang

(10) Patent No.: US 11,314,962 B2
(45) Date of Patent: Apr. 26, 2022

(54) ELECTRONIC DEVICE AND METHOD FOR CONTROLLING FINGERPRINT RECOGNITION-BASED ELECTRONIC DEVICE

(71) Applicant: SHANGHAI HARVEST INTELLIGENCE TECHNOLOGY CO., LTD., Shanghai (CN)

(72) Inventor: Jiandong Huang, Shanghai (CN)

( * ) Notice: Subject to any disclaimer, the term of this patent is extended or adjusted under 35 U.S.C. 154(b) by 0 days.

(21) Appl. No.: 16/647,025

(22) PCT Filed: May 22, 2018

(86) PCT No.: PCT/CN2018/087762
§ 371 (c)(1),
(2) Date: Jun. 17, 2020

(87) PCT Pub. No.: WO2019/052215
PCT Pub. Date: Mar. 21, 2019

(65) Prior Publication Data
US 2020/0327305 A1 Oct. 15, 2020

(30) Foreign Application Priority Data
Sep. 15, 2017 (CN) .......................... 201710841077.5

(51) Int. Cl.
*G06K 9/00* (2006.01)
*H04W 4/90* (2018.01)
*G06F 3/044* (2006.01)
*G06F 3/16* (2006.01)
*H04W 4/14* (2009.01)

(52) U.S. Cl.
CPC ......... *G06K 9/00087* (2013.01); *G06F 3/044* (2013.01); *G06F 3/16* (2013.01);
(Continued)

(58) Field of Classification Search
CPC .. G06F 3/044; G06F 3/16; G06F 2203/04105; G06F 3/165; G06F 3/0488;
(Continued)

(56) References Cited

U.S. PATENT DOCUMENTS

2004/0137683 A1* 7/2004 Chang ............... H01L 29/40114
438/263
2008/0045806 A1* 2/2008 Keppler ............. G06K 9/00885
600/300

(Continued)

*Primary Examiner* — Premal R Patel

(57) ABSTRACT

An electronic device and a command execution method for a fingerprint recognition-based electronic device are provided. The electronic device includes a display unit and a sensing unit. A fingerprint recognition area is provided on the display unit. When the captured fingerprint information includes fingerprint information of at least two fingers, it means that the user touches the fingerprint recognition area with multiple fingers, it is likely that an emergency occurs. Then, the fingerprint recognition unit matches the collected fingerprint information with the preset fingerprint information, and if the matching is successful, the processing unit executes a corresponding operation command. Compared with the existing technology, the electronic device of the present disclosure facilitates user operations and makes sending an emergency message more conveniently, efficiently and secretly; on the other hand, the electronic device greatly reduces the overall thickness of mobile devices, making mobile devices thinner and lighter to meet market demand.

19 Claims, 12 Drawing Sheets

(52) U.S. Cl.
CPC ............ *G06K 9/0002* (2013.01); *H04W 4/14* (2013.01); *H04W 4/90* (2018.02); *G06F 2203/04105* (2013.01)

(58) Field of Classification Search
CPC ......... G06F 3/0414; H04W 4/90; H04W 4/14; G06K 9/0002; G06K 9/00087; G06K 9/0004; H01L 27/146; H01L 27/14643
See application file for complete search history.

(56) References Cited

U.S. PATENT DOCUMENTS

| | | | | |
|---|---|---|---|---|
| 2012/0049193 | A1* | 3/2012 | Saito | G02F 1/13454 |
| | | | | 257/59 |
| 2013/0131474 | A1* | 5/2013 | Gu | A61B 5/02416 |
| | | | | 600/324 |
| 2013/0291933 | A1* | 11/2013 | Kupich | H01L 31/182 |
| | | | | 136/255 |
| 2014/0054590 | A1* | 2/2014 | Kanegae | H01L 29/6675 |
| | | | | 257/57 |
| 2014/0054737 | A1* | 2/2014 | Okino | H01L 27/14685 |
| | | | | 257/432 |
| 2015/0050775 | A1* | 2/2015 | Yamazaki | H01L 21/02565 |
| | | | | 438/104 |
| 2016/0211301 | A1* | 7/2016 | Hiyama | H01L 27/14629 |
| 2017/0011252 | A1* | 1/2017 | Yang | A61B 8/54 |
| 2017/0351850 | A1* | 12/2017 | Jin | H04L 9/3231 |
| 2018/0158311 | A1* | 6/2018 | Yan | G06K 9/00087 |
| 2018/0239941 | A1* | 8/2018 | Mackey | G06K 9/0004 |
| 2018/0315799 | A1* | 11/2018 | Jiang | H01L 27/323 |

* cited by examiner

Top view of light detection film

Side view of light detection film

G : Gate

Insulating layer

Film substrate

ELECTRONIC DEVICE AND METHOD FOR CONTROLLING FINGERPRINT RECOGNITION-BASED ELECTRONIC DEVICE

BACKGROUND OF THE INVENTION

1. Field of the Invention

The present disposure relates to application field of electronic device, and more particularly relates to an electronic device and a method for controlling fingerprint recognition-based electronic device.

2. Description of the Prior Art

With the development of science and technology and the advancement of technology, the touch display panels have been widely used in devices requiring human-computer interaction interfaces, such as operation screens of industrial computers, tablet computers, touch screens of smart phones, etc.

However, there is still much room for improvement in human-computer interface technology. Taking the terminal sending emergency message as an example, the current method generally requires the user to unlock the login interface, and then dial the "110" phone or write an emergency message. However, in actual application scenarios, when a user encounters an emergency, it is difficult to dial an emergency call or send an emergency message. For example, when a user encounters an infringement by a criminal, the method of dialing a call or sending a text message to alarm is not only slow and inefficient, but also easy to be discovered by the gangster, threatening the life of the victim. As another example, when a user encounters a sudden natural disaster, due to the short escape time, it is relatively difficult for the user to quickly and accurately dial the emergency telephone number or send the correct emergency message. Therefore, it is particularly necessary to provide an electronic device that can quickly, efficiently and secretly send instructions, especially an electronic device that sends an emergency instruction.

SUMMARY OF THE INVENTION

For this reason, it is necessary to provide a technical scheme for an electronic device and a method for controlling fingerprint recognition-based electronic device to solve the problem of the low confidentiality, slow speed, low efficiency when the terminal executes the command.

To achieve the above objective, an electronic device is provided, which includes a display unit, a sensing unit, a fingerprint information setting unit, a fingerprint recognition unit and a processing unit.

A fingerprint recognition area is provided on the display unit, and the sensing unit is disposed below the fingerprint recognition area.

The fingerprint information setting unit is configured to preset the correspondence between an operation command and a preset fingerprint information, and the preset fingerprint information includes preset fingerprint information of at least two fingers of a user.

The sensing unit is configured to capture fingerprint information placed on the fingerprint recognition area.

When the synchronously captured fingerprint information includes the fingerprint information of at least two fingers, the fingerprint recognition unit is configured to compare the synchronously captured fingerprint information with preset fingerprint information;

If the synchronously captured fingerprint information is matched with the preset fingerprint information, the processing unit is configured to execute the operation command corresponding to the preset fingerprint information, otherwise the processing unit does not execute the operation command corresponding to the preset fingerprint information.

In some embodiment, the electronic device includes a capacitance detection unit and a pressure sensing unit disposed between the display unit and the sensing unit;

wherein the capacitance detection unit is configured to detect the capacitance change value per unit time on the pressure sensing unit;

when the synchronously captured fingerprint information includes fingerprint information of at least two fingers, the processing unit determines whether the capacitance change value of the current pressing sensing unit is higher than the preset capacitance change value;

if yes, the fingerprint recognition unit is matched with the synchronously captured fingerprint information with the preset fingerprint information, otherwise the fingerprint recognition unit does not implement the matching operation.

In some embodiment, the preset fingerprint information includes at least the preset fingerprint information of the user's four fingers.

The fingerprint recognition unit comparing the synchronously captured fingerprint information with the preset fingerprint information when the synchronously captured fingerprint information comprising fingerprint information of at least two fingers includes:

The fingerprint recognition unit is configured to compare the synchronously captured fingerprint information with the preset fingerprint information when the synchronously captured fingerprint information includes fingerprint information of at least four fingers.

In some embodiment, wherein the step of the fingerprint recognition unit comparing the synchronously captured fingerprint information with the preset fingerprint information includes:

The fingerprint recognition unit is configured to determine whether each synchronously captured fingerprint information by the sensing unit is matched with a fingerprint information in the preset fingerprint information.

If yes, it is determined that the synchronously captured fingerprint information is matched with the preset fingerprint information, otherwise it is determined that it does not match.

In some embodiment, the fingerprint recognition unit comparing the synchronously captured fingerprint information with the preset fingerprint information includes:

The fingerprint recognition unit is configured to calculate its feature value based on the synchronously captured fingerprint information and compare the feature value with the feature value of the preset fingerprint information.

When an error between the two feature values is less than the preset error value, it is determined that the synchronously captured fingerprint information is matched with the preset fingerprint information successfully.

otherwise, it is determined that the synchronously captured fingerprint information fails to match the preset fingerprint information.

In some embodiment, the electronic device includes a prompt unit which is configured to generate a prompt message when the fingerprint recognition unit determines that the synchronously captured fingerprint information is not matched with the preset fingerprint information.

In some embodiment, the prompt message includes one or more of sound prompt message, image prompt message, light prompt message, video prompt message, and vibration prompt message.

In some embodiment, the operation command includes calling an emergency service terminal or sending an emergency service short message to the emergency service terminal.

In some embodiment, emergency service short message includes a current geographic location of the electronic device.

In some embodiment, the electronic device includes a video capturing unit configured to capture video streaming data, and the emergency service short message includes video streaming data captured by the video capturing unit.

In some embodiment, the electronic device includes an audio capturing unit configured to capture audio streaming data, and the emergency service short message includes the audio streaming data captured by the audio capturing unit.

In some embodiment, the sensing unit is configured to emit an light signal and receive the light signal reflected by the user's body so as to capture the user's body information and record the light signal information reflected by the body when receives the light source trigger signal.

The processing unit is configured to capture physiological information of the body according to the light signal reflected by the body and determine whether the physiological information is greater than the corresponding preset physiological value.

If yes, the processing unit executes the operation command corresponding to the preset fingerprint information, otherwise the processing unit does not execute the operation command corresponding to the preset fingerprint information.

In some embodiment, the step of receiving the light signal reflected by the user's body part and capturing the user's body part information includes:

The sensing unit is configured to receive a detection trigger signal in a light detection state, and receives an light signal reflected from a user's body part to capture user's body part information.

The light source trigger signal and the detection trigger signal alternately switch at a preset frequency.

In some embodiment, the physiological information includes any one or more of blood pressure index, pulse rate, and electrocardiogram.

In some embodiment, the display unit is a screen using the active array film transistor as scan driving and data transmission, and the screen includes an AMOLED display, a LCD display, a micro-LED display, a quantum dot display, or an electronic ink display.

In some embodiment, a backlight unit is disposed below the sensing unit, and the sensing unit is disposed between the display unit and the backlight unit when the display unit is the LCD display or the electronic ink display.

In some embodiment, the fingerprint recognition area includes a plurality of fingerprint recognition sub-area, and a sensing unit is correspondingly disposed below each fingerprint recognition sub-area.

In some embodiment, the electronic device further includes a sensing unit control circuit and a command receiving unit configured to receive a start command or a close command of the fingerprint recognition sub-area.

The sensing unit control circuit turns on the sensing unit below the fingerprint recognition sub-area when command receiving unit receives a start command of the fingerprint recognition sub-area, and the sensing unit control circuit turns off the sensing unit below the fingerprint recognition sub-area when command receiving unit receives a close command of the fingerprint recognition sub-area.

In some embodiment, the size of the fingerprint recognition area is fit to the screen size of the display unit.

In some embodiment, the sensing unit includes a TFT image sensing array comprising an array formed by photodiodes or phototransistors. The detection wavelength range of the array formed by the photodiodes or phototransistors covers the visible spectrum or the infrared spectrum.

In some embodiment, the TFT image sensing array is an array formed by photodiodes, and the array formed by photodiodes includes a photosensitive diode region comprising a photodiode layer.

The photodiode layer includes at least two sandwich structures, each sandwich structure includes a p-type semiconductor layer, an i-type semiconductor layer and a n-type semiconductor layer.

The i-type semiconductor layer is a microcrystalline silicon structure or an amorphous germanium silicide structure.

In some embodiment, the microcrystalline silicon structure is a semiconductor layer formed by silane and hydrogen via chemical vapor deposition.

A crystallinity of the microcrystalline silicon structure is higher than 40%, and a band gap of the microcrystalline silicon structure is less than 1.7 eV.

In some embodiment, the amorphous germanium silicide structure is an amorphous semiconductor layer formed by silane, hydrogen, and germane via chemical vapor deposition; a band gap of the amorphous semiconductor layer is less than 1.7 eV.

In some embodiment, a first optical element is disposed on a top surface of the p-type semiconductor layer and configured to reduce reflectivity of light on the top surface of the p-type semiconductor layer or reduce a refraction angle of light in the p-type semiconductor to increase an amount of light incident.

In some embodiment, a second optical element is disposed on the bottom surface of the n-type semiconductor layer and configured to increase the multiple reflectivity of light on the bottom surface of the n-type semiconductor layer. In some embodiment, the TFT image sensing array film is an array formed by the phototransistors, and the array formed by the phototransistor includes a phototransistor sensing area.

A photosensitive film transistor is disposed on the phototransistor sensing area and includes a gate, a source, a drain, an insulating layer, and a light absorbing semiconductor layer.

The photosensitive film transistor has an inverted coplanar structure comprising the gate, the insulating layer, and the source vertically arranged from bottom to top.

The drain and the source are laterally coplanar.

The insulating layer surrounds the gate so that there is no contact between the gate and the source, the gate and the drain.

The source and the drain are isolated by a gap, and a photosensitive leakage current channel is formed between source and drain laterally.

The light absorbing semiconductor layer is disposed in the photosensitive leakage current channel.

In some embodiment, there are multiple sources and drains. The sources are connected in parallel with each other, and the drain are connected in parallel with each other.

The source and the drain are isolated by a gap.

The photosensitive leakage current channel being formed between the source and drain laterally includes:
 a first gap being formed between adjacent sources,
 a drain being placed in the first gap, and
 a second gap formed between adjacent drains;
 a source being formed in the second gap; and
 the source and drain are arranged alternatively and isolated by a gap.

A method for controlling a fingerprint recognition-based electronic device is provided. The electronic device includes a display unit and a sensing unit.

A fingerprint recognition area is provided on the display unit, and the sensing unit is disposed below the fingerprint recognition area; the electronic device includes a fingerprint information setting unit, a fingerprint recognition unit, and a processing unit; the method includes the following steps:

The fingerprint information setting unit presets the correspondence between an operation command and a preset fingerprint information, and the preset fingerprint information includes preset fingerprint information of at least two fingers of a user.

The sensing unit captures fingerprint information placed on the fingerprint recognition area when the synchronously captured fingerprint information comprising the fingerprint information of at least two fingers;

The fingerprint recognition unit compares the synchronously captured fingerprint information with preset fingerprint information.

If the synchronously captured fingerprint information is matched with and the preset fingerprint information, the processing unit executes the operation command corresponding to the preset fingerprint information, otherwise the processing unit does not execute the operation command corresponding to the preset fingerprint information. In some embodiment, the electronic device includes a capacitance detection unit and a pressure sensing unit disposed between the display unit and the sensing unit; the method includes:

The capacitance detection unit detects the capacitance change value per unit time on the pressure sensing unit.

When the synchronously captured fingerprint information includes fingerprint information of at least two fingers, the processing unit determines whether the capacitance change value of the current pressing sensing unit is higher than the preset capacitance change value.

If yes, the fingerprint recognition unit is matched with the synchronously captured fingerprint information with the preset fingerprint information, otherwise the fingerprint recognition unit does not implement the matching operation.

In some embodiment, the preset fingerprint information includes at least the preset fingerprint information of the user's four fingers.

The step of the fingerprint recognition unit comparing the synchronously captured fingerprint information with the preset fingerprint information when the synchronously captured fingerprint information comprising fingerprint information of at least two fingers includes:

the fingerprint recognition unit compares the synchronously captured fingerprint information with the preset fingerprint information when the synchronously captured fingerprint information includes fingerprint information of at least four fingers.

In some embodiment, the step of the fingerprint recognition unit comparing the synchronously captured fingerprint information with the preset fingerprint information includes:

The fingerprint recognition unit determines whether each synchronously captured fingerprint information by the sensing unit is matched with a fingerprint information in the preset fingerprint information.

If yes, it is determined that the synchronously captured fingerprint information is matched with the preset fingerprint information, otherwise it is determined that it does not match.

In some embodiment, the step of fingerprint recognition unit comparing the synchronously captured fingerprint information with the preset fingerprint information includes:

The fingerprint recognition unit calculates its feature value based on the synchronously captured fingerprint information and compares it with the feature value of the preset fingerprint information.

When an error between the two feature values is less than the preset error value, it is determined that the synchronously captured fingerprint information is matched with the preset fingerprint information successfully, otherwise, it is determined that the synchronously captured fingerprint information fails to match the preset fingerprint information.

In some embodiment, the electronic device includes a prompt unit, and the method includes:

the prompt unit generates a prompt message when the fingerprint recognition unit determines that the synchronously captured fingerprint information is not matched with the preset fingerprint information.

In some embodiment, the prompt message includes one or more of sound prompt message, image prompt message, light prompt message, video prompt message, and vibration prompt message.

In some embodiment, the operation command includes calling an emergency service terminal or sending an emergency service short message to the emergency service terminal.

In some embodiment, the emergency service short message includes a current geographic location of the electronic device.

In some embodiment, the electronic device includes a video capturing unit, and the method includes:
 the video capturing unit captures video streaming data, and the emergency service short message includes video streaming data captured by the video capturing unit.

In some embodiment, the electronic device includes an audio capturing unit, and the method includes:
 the audio capturing unit captures audio streaming data, and the emergency service short message includes the audio streaming data captured by the audio capturing unit.

In some embodiment, the method includes:

The sensing unit emits an light signal and receives the light signal reflected by the user's body so as to capture the user's body information and record the light signal information reflected by the body when receives the light source trigger signal.

The processing unit captures physiological information of the body according to the light signal reflected by the body and determines whether the physiological information is greater than the corresponding preset physiological value.

If yes, the processing unit executes the operation command corresponding to the preset fingerprint information, otherwise the processing unit does not execute the operation command corresponding to the preset fingerprint information.

In some embodiment, the step of the sensing unit receiving the light signal reflected by the user's body part and capturing the user's body part information includes:

The sensing unit receives a detection trigger signal in a light detection state, and receives an light signal reflected from a user's body part to capture user's body part information.

The light source trigger signal and the detection trigger signal alternately switches at a preset frequency.

In some embodiment, the physiological information includes any one or more of blood pressure index, pulse rate, and electrocardiogram.

In some embodiment, the display unit is a screen using the active array film transistor as scan driving and data transmission, and the screen includes an AMOLED display, a LCD display, a micro-LED display, a quantum dot display, or an electronic ink display.

In some embodiment, a backlight unit disposed below the sensing unit disposed between the LCD display and the backlight unit when the display unit is the LCD display or the electronic ink display.

In some embodiment, the fingerprint recognition area includes a plurality of fingerprint recognition sub-area, and a sensing unit is correspondingly disposed below each fingerprint recognition sub-area.

In some embodiment, the electronic device further includes a sensing unit control circuit and a command receiving unit, and the method includes:

The sensing unit control circuit turns on the sensing unit below the fingerprint recognition sub-area after command receiving unit receives a start command of the fingerprint recognition sub-area, and the sensing unit control circuit turns off the sensing unit below the fingerprint recognition sub-area after command receiving unit receives a close command of the fingerprint recognition sub-area.

In some embodiment, the size of the fingerprint recognition area is fit to the screen size of the display unit.

In some embodiment, sensing unit includes a TFT image sensing array comprising an array formed by photodiodes or phototransistors.

The detection wavelength range of the array formed by the photodiodes or phototransistors covers the visible spectrum or the infrared spectrum.

In some embodiment, the TFT image sensing array is an array formed by photodiodes, and the array formed by photodiodes includes a photosensitive diode region comprising a photodiode layer.

The photodiode layer includes a p-type semiconductor layer, a i-type semiconductor layer and a n-type semiconductor layer, and the p-type semiconductor layer, i-type semiconductor layer and n-type semiconductor layer are stacked from top to bottom.

The i-type semiconductor layer is a microcrystalline silicon structure or an amorphous germanium silicide structure.

In some embodiment, the microcrystalline silicon structure is a semiconductor layer formed by silane and hydrogen via chemical vapor deposition.

A crystallinity of the microcrystalline silicon structure is higher than 40%, and a band gap of the microcrystalline silicon structure is less than 1.7 eV.

In some embodiment, the amorphous germanium silicide structure is an amorphous semiconductor layer formed by silane, hydrogen, and germane via chemical vapor deposition; a band gap of the amorphous semiconductor layer is less than 1.7 eV.

In some embodiment, a first optical element is disposed on a top surface of the p-type semiconductor layer and reduce reflectivity of light on the top surface of the p-type semiconductor layer or reduce a refraction angle of light in the p-type semiconductor to increase the amount of light incident.

In some embodiment, a second optical element is further disposed on the bottom surface of the n-type semiconductor layer and configured to increase the multiple reflectivity of light on the bottom surface of the n-type semiconductor layer.

In some embodiment, the TFT image sensing array film is an array formed by the phototransistors, and the array formed by the phototransistor includes a phototransistor sensing area.

A photosensitive film transistor is disposed on the phototransistor sensing area and includes a gate, a source, a drain, an insulating layer, and a light absorbing semiconductor layer.

The photosensitive film transistor has an inverted coplanar structure and includes the gate, the insulating layer, and the source vertically arranged from bottom to top.

The drain and the source are laterally coplanar.

The insulating layer surrounds the gate so that there is no contact between the gate and the source, the gate and the drain.

The source and the drain are isolated by a gap, and a photosensitive leakage current channel is formed between source and drain laterally.

The light absorbing semiconductor layer is disposed in the photosensitive leakage current channel.

In some embodiment, there are multiple sources and drains, the sources are connected in parallel with each other, and the drain are connected in parallel with each other.

The source and the drain are isolated by a gap.

The photosensitive leakage current channel being formed between the source and drain laterally includes:

a first gap being formed between adjacent sources, a drain being placed in the first gap, a second gap formed between adjacent drains;

a source being formed in the second gap; and the source and drain are arranged alternatively and isolated by a gap.

Therefore, the present disclosure has following advantages. the present disclosure has following advantages. By setting a fingerprint recognition area on the display unit and a sensing unit below the fingerprint recognition area, the sensing unit can capture the user's fingerprint information when the user just places his finger on the fingerprint recognition area. When the fingerprint information captured at the same time includes fingerprint information of at least two fingers, it means that the user touches the fingerprint recognition area with at least two fingers at this time, it is likely that an emergency occurs. At this time, the fingerprint recognition unit is matched with the synchronously captured fingerprint information with the preset fingerprint information, and after the matching is successful, the processing unit executes a corresponding operation command, such as triggering an alarm call or sending a help message. Compared with the traditional way in which mobile devices additionally provide sensors outside the display screen area, the electronic device of the present disclosure facilitates user operations on the one hand and makes the process of sending out a emergency message more conveniently, efficiently and secretly on the other hand, effectively reducing the overall thickness of mobile devices, making mobile devices thinner and lighter to meet market demand.

DESCRIPTION OF THE PREFERRED EMBODIMENTS

In order to explain the technical content, structural features, achieved objectives, and effects of the technical solution in detail, the following describes it in detail with reference to specific embodiments and accompanying drawings.

Figure 1:
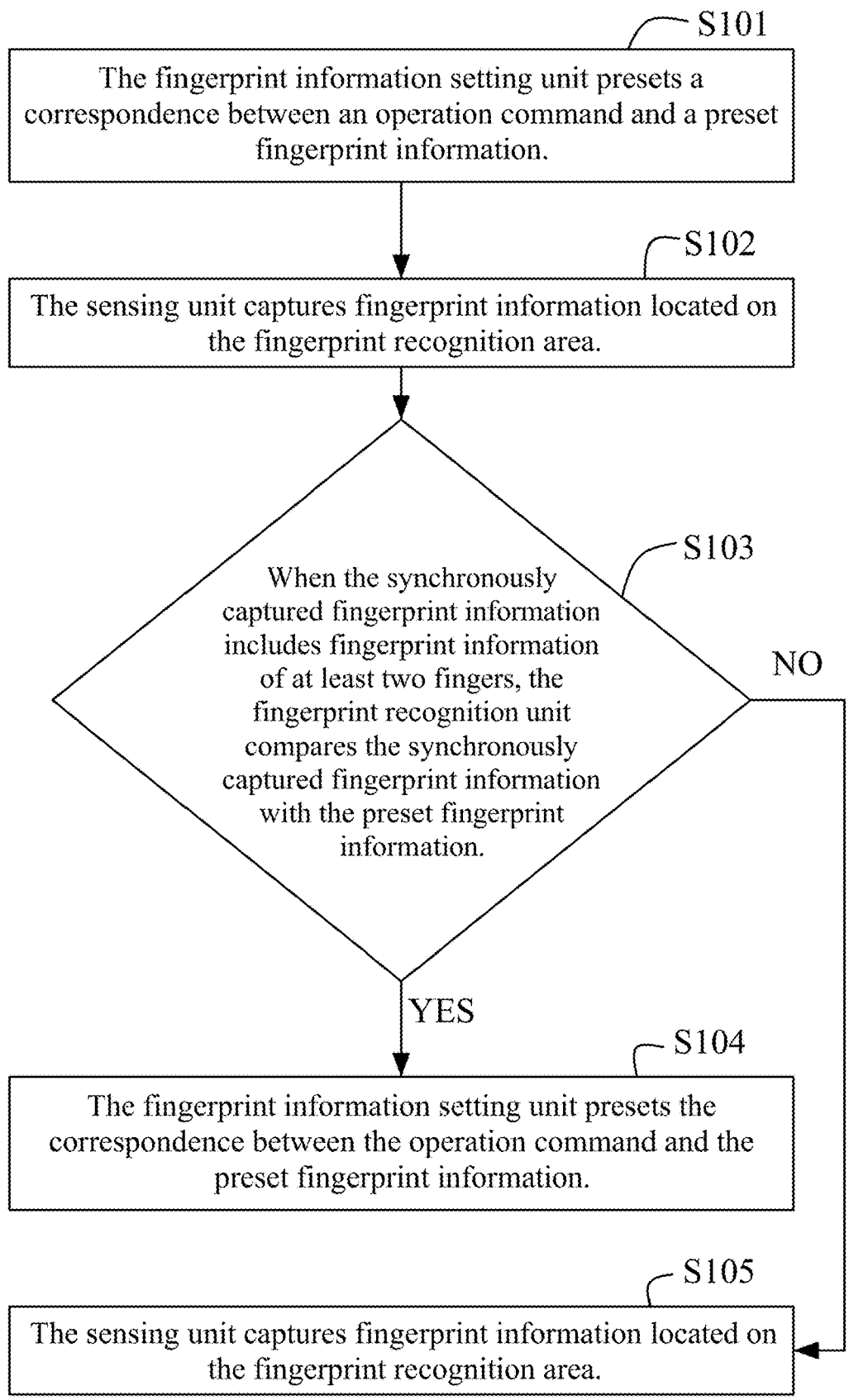
FIG. 1 is a flowchart of a method for controlling fingerprint recognition-based electronic device according to an embodiment of the present disclosure.

Please refer to FIG. 1, FIG. 1 is a flowchart of a method for controlling fingerprint recognition-based electronic device according to an embodiment of the present disclosure. The method is applied to an electronic device, and the electronic device includes a display unit and a sensing unit. A fingerprint recognition area is provided on the display unit and the sensing unit is disposed below the fingerprint recognition area. The electronic device is a device having a touch display screen, such as a smart mobile device, e.g. a mobile phone, a tablet computer, a personal digital assistant, or an electronic device such as a personal computer or a computer for industrial equipment.

The electronic device further includes a fingerprint information setting unit, a fingerprint recognition unit, and a processing unit. The processing unit is an electronic component with a data processing function, such as a CPU, GPU, DSP, MCU, etc. The fingerprint recognition unit may be a physical module, such as a fingerprint recognition chip, or a virtual module, such as a storage medium storing a fingerprint recognition algorithm, and the fingerprint recognition algorithm is called by the processor to implement the fingerprint recognition function. The fingerprint information setting unit is a virtual module, which is such as implemented by a computer program. The method includes the following steps:

First, a step S101 is implemented. The fingerprint information setting unit presets a correspondence between an operation command and a preset fingerprint information.

The correspondence between the operation command and the preset fingerprint information can be stored in the storage unit of the electronic device (e.g. the memory of the mobile phone and the hard disk of the computer) or the storage unit of the server. When the preset correspondence between the operation command and the preset fingerprint information is needed, only a communication connection between the electronic device and the server is established, and then the preset fingerprint information stored in advance can be captured from the server. The communication connection includes a wired communication connection or a wireless communication connection.

The preset fingerprint information is the fingerprint information that the user enters and stores in advance. To avoid user maloperation, the preset fingerprint information includes preset fingerprint information of at least two fingers of the user. In some embodiment, in order to better conform to the user's usage habits, the preset fingerprint information of the two fingers is the fingerprint information of the user's same hand. When an emergency occurs, the user only needs to hold the terminal with one hand to ensure that the finger where the fingerprint information is entered is in contact with the fingerprint recognition area. When the matching is successful, the corresponding operation command can be triggered.

Then, a step S102 is implemented. The sensing unit captures fingerprint information located on the fingerprint recognition area. In the embodiment, a size of the fingerprint recognition area is fit to a screen size of the display unit. For example, the size of the fingerprint recognition area may be equal to the screen size of the display unit. This can ensure that when an emergency occurs, the user's finger only needs to be in contact with the terminal screen, and the sensor unit can capture the user's fingerprint information in time, making fingerprint information capture more efficient and convenient.

Thereafter, a step S103 is implemented. When the synchronously captured fingerprint information includes fingerprint information of at least two fingers, the fingerprint recognition unit compares the synchronously captured fingerprint information with the preset fingerprint information. If the synchronously captured fingerprint information is matched with the preset fingerprint information, a step S104 in which the processing unit executes the operation command corresponding to the preset fingerprint information is implemented; otherwise, a step S105 in which the processing unit does not execute the operation command corresponding to the preset fingerprint information.

In the embodiment, the step of the fingerprint recognition unit comparing the synchronously captured fingerprint information with the preset fingerprint information includes the following steps. The fingerprint recognition unit determines whether each fingerprint information synchronously captured by the sensing unit is matched with a fingerprint information in the preset fingerprint information. If yes, it is determined that the synchronously captured fingerprint information is matched with the preset fingerprint information, otherwise it is determined that it does not match. For example, at a certain moment, the sensing unit simultaneously captures two fingerprint information, including the first fingerprint information and the second fingerprint information. The fingerprint recognition unit will sequentially traverse the fingerprint database (with at least two preset fingerprint information stored), and sequentially determine whether there is fingerprint information in the fingerprint database that is matched with the first fingerprint information and the second fingerprint information. If there are both, it is determined that the two synchronously captured fingerprint information currently by the sensing unit match the preset fingerprint information. In this way, when the user touches the screen with a finger where the preset fingerprint information is entered and another finger where the preset fingerprint information is not entered, the synchronously captured fingerprint information by the sensing unit does not both match the preset fingerprint information, so the corresponding operation command will not be triggered. This setting can effectively reduce the probability of user maloperation and prevent the processor from untimely issuing operation commands that the user does not want to trigger.

It is still easy to cause the user's maloperation by determining whether the user encounters an emergency situation based on the user's fingerprint information alone. For example, if the two fingers of the user just accidentally touch the fingerprint recognition area and the fingerprint information of the two fingers are preset fingerprint information previously entered, the corresponding operation command will be triggered. In order to further improve the accuracy of the emergency determination of the electronic device, the electronic device includes a capacitance detection unit and a pressure sensing unit. The pressure sensing unit is disposed between the display unit and the sensing unit. The method also includes the following steps.

First, the capacitance detection unit detects the capacitance change value per unit time on the pressure sensing unit. The capacitance detection unit can be realized by a capacitance detection circuit. The pressure sensing unit, as the name suggests, is a device for detecting the strength of the force exerted by the user on the screen. The greater the force is exerted by the user, the greater the pressure value is detected by the pressure sensing unit and the greater the corresponding capacitance become. When the user encounters an emergency, it usually appears that the hand clasps the terminal screen. That is, a relatively large force is applied to the terminal screen in a short period of time, so it can be determined by detecting the amount of change in capacitance of the pressure sensing unit per unit time.

Then, when the synchronously captured fingerprint information includes fingerprint information of at least two fingers, the processing unit determines whether the capacitance change value of the current pressing sensing unit is higher than the preset capacitance change value. If yes, the fingerprint recognition unit is matched with the synchronously captured fingerprint information with the preset fingerprint information, otherwise the fingerprint recognition unit does not implement the matching operation. The preset capacitance change value may be a value that is adjusted according to actual needs or may be a value that is fixed in the storage unit when the electronic device is shipped from the factory. The unit time may be 1 second, 2 seconds, or other time intervals. By comparing the capacitance change value of the pressure sensing unit with the preset capacitance change value, the electronic device triggers the operation command only when it receives a large force per unit time of the screen, thereby improving the accuracy of the emergency determination.

In order to further improve the accuracy of emergency determination, in some embodiments, the preset fingerprint information includes at least the preset fingerprint information of the user's four fingers. The step of the fingerprint recognition unit comparing the synchronously captured fingerprint information with the preset fingerprint information when the synchronously captured fingerprint information includes fingerprint information of at least two fingers includes the fingerprint recognition unit comparing the synchronously captured fingerprint information with the preset fingerprint information when the synchronously captured fingerprint information includes fingerprint information of at least four fingers. In short, when the user grips the terminal screen, generally at least four fingers touch the screen. The operation command is triggered only when the sensing unit simultaneously captures at least four pieces of fingerprint information matching the preset fingerprint information. Compared with the two-finger triggering method, the determination of the emergency situation is more accurate.

In some embodiments, the fingerprint recognition unit comparing the synchronously captured fingerprint information with the preset fingerprint information includes the fingerprint recognition unit calculating its feature value based on the synchronously captured fingerprint information and comparing it with the feature value of the preset fingerprint information. When an error between the two feature values is less than a preset error value, it is determined that the synchronously captured fingerprint information is matched with the preset fingerprint information successfully; otherwise, it is determined that the synchronously captured fingerprint information fails to match the preset fingerprint information. Comparing the captured fingerprint information with preset fingerprint information by feature values can effectively improve the accuracy of fingerprint information comparison.

In some embodiments, the electronic device includes a prompt unit.

The above-mentioned method includes the prompting unit generating prompt message when the fingerprint recognition unit determines that the synchronously captured fingerprint information is not matched with the preset fingerprint information. Further, the prompt message includes one or more of sound prompt message, image prompt message, light prompt message, video prompt message, and vibration prompt message. The voice prompt message includes audio information prompting the user that "fingerprint information matching failed". The image prompt message includes pop-up prompt message prompting the user to input fingerprint information again. The light prompt message includes prompt message of changing the brightness of the current screen or letting the screen emit different colors. The video prompt message includes a video prompt message prompting the user that "fingerprint information matching failed". The vibration prompt message includes starting the vibration function of the terminal (i.e., electronic device). In short, the prompt message is just to let the user know as soon as possible the "current fingerprint information matching failed". As for the selection of the prompt message format, it can be adjusted according to the settings of different manufacturers.

In order for the emergency service terminal (such as the 110 alarm center, emergency command center, etc.) to be able to know the situation of the user experiencing the emergency in a timely manner, in some embodiment, the operation command includes calling an emergency service terminal or sending an emergency service short message to the emergency service terminal. In some embodiments, the emergency service short message includes a current geographic location of the electronic device. In this way, when the emergency service end receives the emergency service short message sent by the user, it can accurately locate the current location of the user, and then adopt effective rescue measures for processing.

In some embodiments, the electronic device includes a video capturing unit. The above-mentioned method includes the video capturing unit configureconfigured for capturing video streaming data, and the emergency service short message includes video streaming data captured by the video capturing unit. In this way, after receiving the emergency service short message, the emergency service terminal can further understand some of the current user needs or situation through the video streaming data, so as to take more targeted rescue measures to rescue.

In order to enable the emergency service end to receive the emergency service short message sent by the electronic device more quickly, in other embodiment the electronic device includes an audio capturing unit. The above-mentioned method includes the audio capturing unit capturing audio streaming data. The emergency service short message includes the audio streaming data captured by the audio capturing unit. Compared with video streaming data, audio streaming data has advantages of lower bandwidth and faster transmission speed. After the audio information carried by the emergency server is received, it can feedback the current emergency situation. For example, the audio streaming data is a general description of the current emergency situation encountered by the user, and the emergency server can take more targeted rescue measures to rescue.

In the case of an emergency, in addition to gripping the terminal with the hand, some information of the user's body generally changes in a unit time. Therefore, the accuracy of the emergency determination of the electronic device can be further improved by detecting the change of the user's body information. The above-mentioned method includes the following steps.

When the sensing unit receives the light source trigger signal, it emits an light signal and receives the light signal reflected by the user's body so as to capture the user's body information and record the light signal information reflected by the body. The processing unit captures physiological information of the body according to the light signal reflected by the body and determines whether the physiological information is greater than a corresponding preset physiological value. If yes, the processing unit executes the operation command corresponding to the preset fingerprint information, otherwise the processing unit does not execute the operation command corresponding to the preset fingerprint information.

Further, the physiological information includes any one or more of blood pressure index, pulse rate, and electrocardiogram. The preset physiological value can be set according to actual needs. For example, if the physiological information is a blood pressure index, the preset physiological value is the preset blood pressure index.

When light passes through the human skin and enters other tissues below the body surface, some of the light will be absorbed, and some light will be reflected and scattered. The change of the light path depends on the structure of the tissue below the skin. In general, human blood can absorb more light than surrounding tissues, so the less light is reflected back when the light signal encounters more blood. Therefore, the blood volume information of the user can be captured by detecting the light signal information reflected by the body, and then the change information of the user's blood volume can be captured.

For pulse rate, the blood volume of the human body generally increases or decreases with each beat of the pulse, so the processing unit can also analyze the reflected light signal information to capture the change information of the user's blood volume, and then capture pulse rate data and display it on the display unit. As for blood pressure index, electrocardiogram, etc., the same or similar method can capture these values and will not be described here again. In short, by sending light signals from the sensing unit and detecting the reflected light signal, some tissue structure information of the current human body can be captured, and then further analyzed and converted by the processing unit to capture corresponding physiological information. Through the above solution, by the comparison between the physiological information and the preset physiological value, the emergency determination is more accurate, and the user's maloperation is effectively avoided.

In some embodiments, capturing the body part information of the user includes capturing the body information when it is detected that the distance between the body and the sensing unit is less than a preset distance. The sensing unit can determine the distance between the current user's body part and the sensing unit by detecting the time difference between the emitted light signal and the received reflected light signal. In some other embodiments, the sensing unit may also determine whether the distance between the body part and the sensing unit is less than a preset distance by sensing changes in ambient light intensity. Only when the distance between the body and the sensing unit is less than the preset distance, the sensing unit captures the body information. For example, when the hand grips the terminal screen, the distance between the user's hand and the sensing unit is small enough to capture the blood information in the hand. This can effectively avoid the user's maloperation, more in line with the user's usage habits, and improve the user's sensory experience.

A liquid crystal display (LCD) screen or an active array organic light-emitting diode (AMOLED) display screen, etc., both of them scan and drive a single pixel through a film transistor (TFT) structure to realize the display function of the on-screen pixel array. The main structure for forming the TFT switching function is a semiconductor field effect transistor (FET), and the well-known semiconductor layer is mainly made of amorphous silicon, polycrystalline silicon, indium gallium zinc oxide (IGZO), or an organic compound mixed with carbon nano materials. Since the structure of a photo diode may also be ready by such semiconductor materials and the production equipment is also compatible with the production equipment of the TFT array, so in recent years the TFT photo diode is produced by the TFT array manufacturing method and is widely used in X-ray sensing flat panel devices, such as those described in the patents CN103829959B and CN102903721B of the People's Republic of China.

In fact, in the application of light detection, the TFT structure has the characteristics of light-sensitive function: Generally, when the TFT is controlled to be turned off by the gate voltage, no current flows from the source to the drain. However, when the TFT is exposed to the light, the electron-hole pair in the semiconductor is excited by the energy of the light, and the field effect of the TFT structure will cause the electron-hole pair to be separated, thereby causing the TFT to leak current. This leakage current characteristics make TFT arrays be gradually applied to the technology of light detection or infrared light detection, such as described in the patents of the People's Republic of China CN100568072C and CN105044952A. If such a well-known TFT light sensing array film is arranged in the display structure, it can be used as an implementation solution for integrating the light detection function in the display.

In light detection applications, there is still much room for improvement in the structure of the traditional TFT device. Under normal circumstances, the lighting may include changes of more than 3 orders of magnitude (60 dB) from the darkest area to the brightest area. For infrared light detection applications using TFT leakage current operating in the shutdown region, it is necessary to increase the photosensitivity of the TFT and the signal-to-noise ratio (SNR) of the device, and it is also necessary to avoid increasing the complexity and power consumption of the overall system.

In some embodiment, the sensing unit in the present disclosure may include a TFT image sensing array. The TFT image sensing array includes an array formed by photodiodes or phototransistors. The detection wavelength range of the array formed by the photodiodes or phototransistors covers the visible spectrum or the infrared spectrum. The TFT image sensing array is composed of M×N TFT image sensing films, and each TFT image sensing film is configured to detect one pixel, so the TFT image sensing array can be used to detect M×N pixels to form corresponding image.

For each TFT image sensing film, there are several embodiments.

In some embodiments, the TFT image sensing array is an array formed by photodiodes, and the array formed by photodiodes includes a photosensitive diode region. An LCD panel or an OLED (Organic Light Emitting Diode) display panel is driven by a TFT structure to scan a single pixel to realize a display function of a pixel array on the panel. A main structure for forming a TFT switching function is a Field Effect Transistor (FET), wherein well-known semiconductor layer materials mainly include amorphous silicon, polycrystalline silicon, indium gallium zinc oxide (IGZO), organic compounds mixed with nano carbon materials, etc. Since the structure of a photodiode can also be prepared from such semiconductor materials, and production equipment is also compatible with the production equipment of TFT arrays, the TFT photodiode has started to be produced by a TFT array preparation method in recent years. A specific structure of the photodiode may refer to descriptions on the structure of the sensing unit in a U.S. Pat. No. 6,943,070B2 and a PRC patent CN204808361U. A production process of the TFT image sensing array is different from that of the TFT structure of the display panel in that a pixel opening region of the display panel is changed to a photo-sensing region in the production process. The TFT may be prepared by a method of using thin glass as a substrate or using a high temperature-resistant plastic material as the substrate, as described in the U.S. Pat. No. 6,943,070B2.

Figure 2:
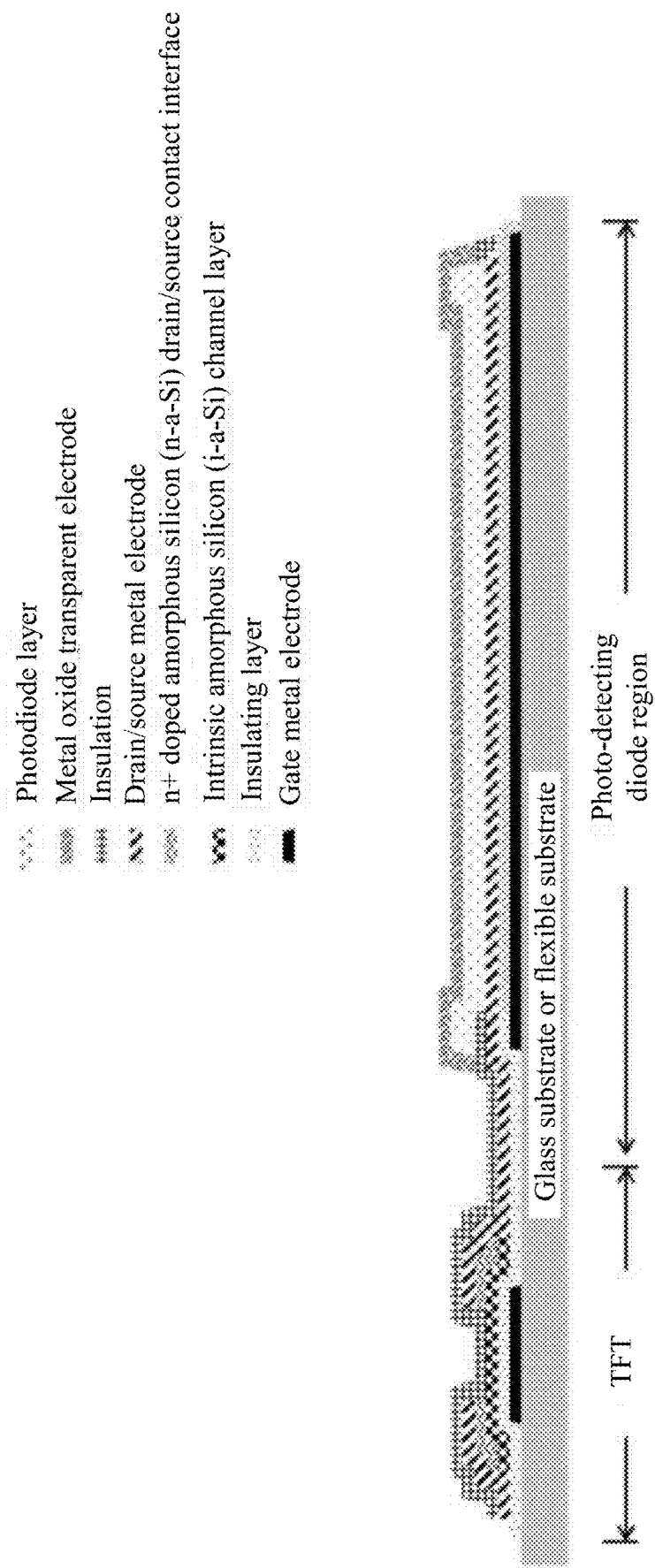
FIG. 2 is a structure diagram of TFT image sensing array film to an embodiment of the present disclosure.

The existing TFT image sensing array film is susceptible to factors such as the surrounding ambient light or visible light reflection and refraction from the display pixels so it would cause optical interference and severely affecting the signal to noise ratio (SNR) of the TFT image sensing array film embedded under the display panel. In order to improve the SNR, as shown in FIG. 2, the sensing unit of the present disclosure is further improved, so that the TFT image sensing array film can detect and identify the infrared signal reflected by the user's body part. The specific structure is as follows:

The photodiode layer includes a p-type semiconductor layer, a i-type semiconductor layer and an n-type semiconductor layer. The p-type semiconductor layer, i-type semiconductor layer, and n-type semiconductor layer are stacked from top to bottom. The i-type semiconductor layer is a microcrystalline silicon structure or an amorphous germanium silicide structure. The microcrystalline silicon structure is a semiconductor layer formed by silane and hydrogen via chemical vapor deposition. The microcrystalline silicon structure is a semiconductor layer formed by silane and hydrogen via chemical vapor deposition, the crystallinity of the microcrystalline silicon structure is higher than 40%, and the band gap of the microcrystalline silicon structure is less than 1.7 eV. The amorphous germanium silicide structure is an amorphous semiconductor layer formed by silane, hydrogen, and germane via chemical vapor deposition; the band gap of the amorphous semiconductor layer is less than 1.7 eV.

The band gap is a width of forbidden band (unit is electron volts (eV)). The energy of electrons in solids cannot be continuously measured, because they are discontinuous energy bands. To conduct electricity, free electrons must be existed. The energy band which has free electron is called the conduction band (which can conduct electricity). To become a free electron, a bound electron must capture sufficient energy to transition from the valence band to the conduction band. The minimum value of energy of transition is the band gap. The band gap is an important characteristic parameter of semiconductors. It's the value is mainly determined by the energy band structure of the semiconductor. It is related to the crystal structure and the bonding properties of atoms.

At room temperature (300K), the band gap of germanium is about 0.66 eVv. Germanium is contained in silane. The band gap of i-type semiconductor layer will be reduced after doped with germanium. When the band gap is less than 1.7 eV, it means that the i-type semiconductor layer can receive light signals in a wavelength range from visible spectrum or infrared spectrum (or near-infrared light). The operating wavelength range of photodiodes containing amorphous or microcrystalline germanium silicide structures can be extended to the range of light wavelengths from 600 nm to 2000 nm via adjusting the GeH4 concentration of chemical meteorological deposits. In some embodiments, on the basis of the first embodiment, in order to improve the quantum efficiency of photoelectric conversion, the amorphous silicon photodiode can also be formed by stacking p-type/i-type/n-type structures with a double junction or more. The p-type/i-type/n-type material of the first junction layer of the photodiode is still an amorphous silicon structure. The p-type/i-type/n-type material above the second junction layer may be a microcrystalline structure, a polycrystalline structure, or doped with compound materials that can extend the photosensitive wavelength range. In short, multiple groups of p-type/i-type/n-type structures can be stacked on top of each other to form a photodiode structure to achieve a photodiode structure. For each p-type/i-type/n-type structure, the photodiode structure described in the first embodiment is used.

In some embodiments, on the basis of the first or second embodiment, for each p-type/i-type/n-type structure, the p-type semiconductor layer may be a multilayer structure with more than two layers. For example, the p-type semiconductor layer is a three-layer structure which includes a first p-type semiconductor layer (p1 layer), a second p-type semiconductor layer (p2 layer), and a third p-type semiconductor layer (p3 layer) from top to bottom. The p1 layer can adopt an amorphous structure and be heavily doped with boron (the boron concentration is more than twice that of the standard process). The p2 and p3 adopt a microcrystalline structure and are normally doped with boron (doped in accordance with the standard process concentration). The absorption of light can be reduced by the thinner p2 and p3 layers, so that light enters the i-layer as much as possible and is absorbed by the i layer to improve photoelectric conversion rate. On the other hand, the p2 layer and the p3 layer are normally doped with boron, which can effectively prevent the built-in potential from being deteriorated due to the heavy doping of p1 layer. When the p-type semiconductor layer includes a multi-layer structures having other numbers of layer, the structure is similar as other layer, and the details are not described again.

Similarly, the n-type semiconductor layer may have a multilayer structure with more than two layers. For example, the n-type semiconductor layer is a three-layer structure which includes a first n-type semiconductor layer (n1 layer), a second n-type semiconductor layer (n2 layer), and a third n-type semiconductor layer (n3 layer) from top to bottom. The n3 layer can adopt an amorphous structure and be heavily doped with phosphorus (the phosphorus content is more than twice that of the standard process). The n1 and the n2 adopt microcrystalline structure and are normally doped with phosphorus (according to standard production process). The absorption of light can be reduced by the thinner p2 and p3 layers, so that light enters the i-layer as much as possible and is absorbed by the i-layer to improve photoelectric conversion rate. On the other hand, the normal phosphorus doping of the n1 layer and the n2 layer can effectively prevent the built-in potential from being deteriorated due to the heavy doping of the n3 layer. When the n-type semiconductor layer includes a multi-layer structure having other numbers of layer, the structure is similar as other layers, and the details are not described again.

Figure 7:
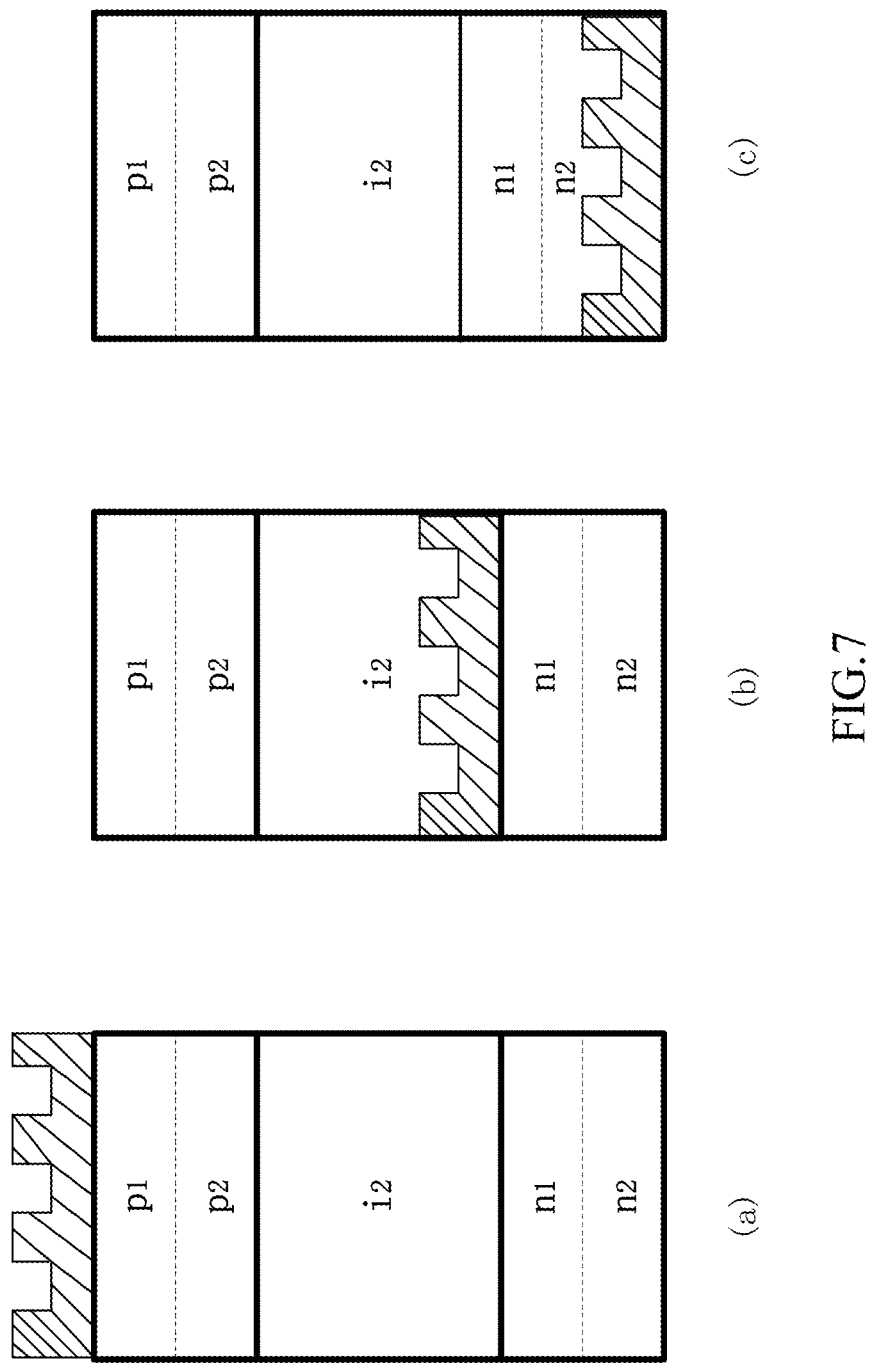
FIG. 7 is a schematic diagram of disposing of optical element to an embodiment of the present disclosure.

In some embodiments, as shown in (a) of FIG. 7, first optical element is disposed on a top surface of the p-type semiconductor layer. The first optical element is configured to reduce reflectivity of light on the top surface of the p-type semiconductor layer or reduce refraction angle of light in the p-type semiconductor to increase the amount of light incident. Reducing the angle of refraction of light in the p-type semiconductor layer allows the light to enter the p-type semiconductor layer as close to the vertical direction as possible, so that the light is absorbed as much as possible by the i-type semiconductor layer below the p-type semiconductor layer, thereby the photoelectric conversion rate of the photodiodes is further improved. the first optical element is disposed on the top surface of the uppermost p-type semiconductor layer when the p-type semiconductor layer is a multilayer structure.

The first optical element includes a photonic crystal structure with a periodically changing refractive index, micro lens array structure or diffuse scattering structure with aperiodic change of refractive index. The refractive index of the first optical element is lower than the refractive index of the p-type semiconductor layer, so that the incident angle is lower than the refractive angle after the light is refracted by the first optical element. That means the light enters the p-type semiconductor layer as close to the vertical direction as possible.

In some embodiments, as shown in (b) (c) in FIG. 7, a second optical element is further disposed on the bottom surface of the n-type semiconductor layer. The second optical element is configured to increase the multiple reflectivity of light on the bottom surface of the n-type semiconductor layer. The multiple reflectivity means that the light enters the i-type semiconductor layer after being reflected by the second optical element and is absorbed by the i-type semiconductor layer. The absorbed light enters the i-type semiconductor layer after being reflected again by the second optical element. This is repeated many times to improve the photoelectric conversion rate of the i-type semiconductor layer. The second optical element is disposed on the bottom surface of the lowermost n-type semiconductor layer when the n-type semiconductor layer is a multilayer structure.

The second optical element includes a photonic crystal structure with a periodically changing refractive index or a diffuse scattering structure with aperiodic change of refractive index. The refractive index of the second optical element is lower than the refractive index of the n-type semiconductor layer. In this way, the light can be reflected as much as possible on the bottom surface of the n-type semiconductor layer, so that the reflected light is absorbed again by the i-type semiconductor layer, thereby the signal in the wavelength range of light absorbed by i-type semiconductor is appropriately amplified to increase the photoelectric flux in this wavelength range.

Figure 3:
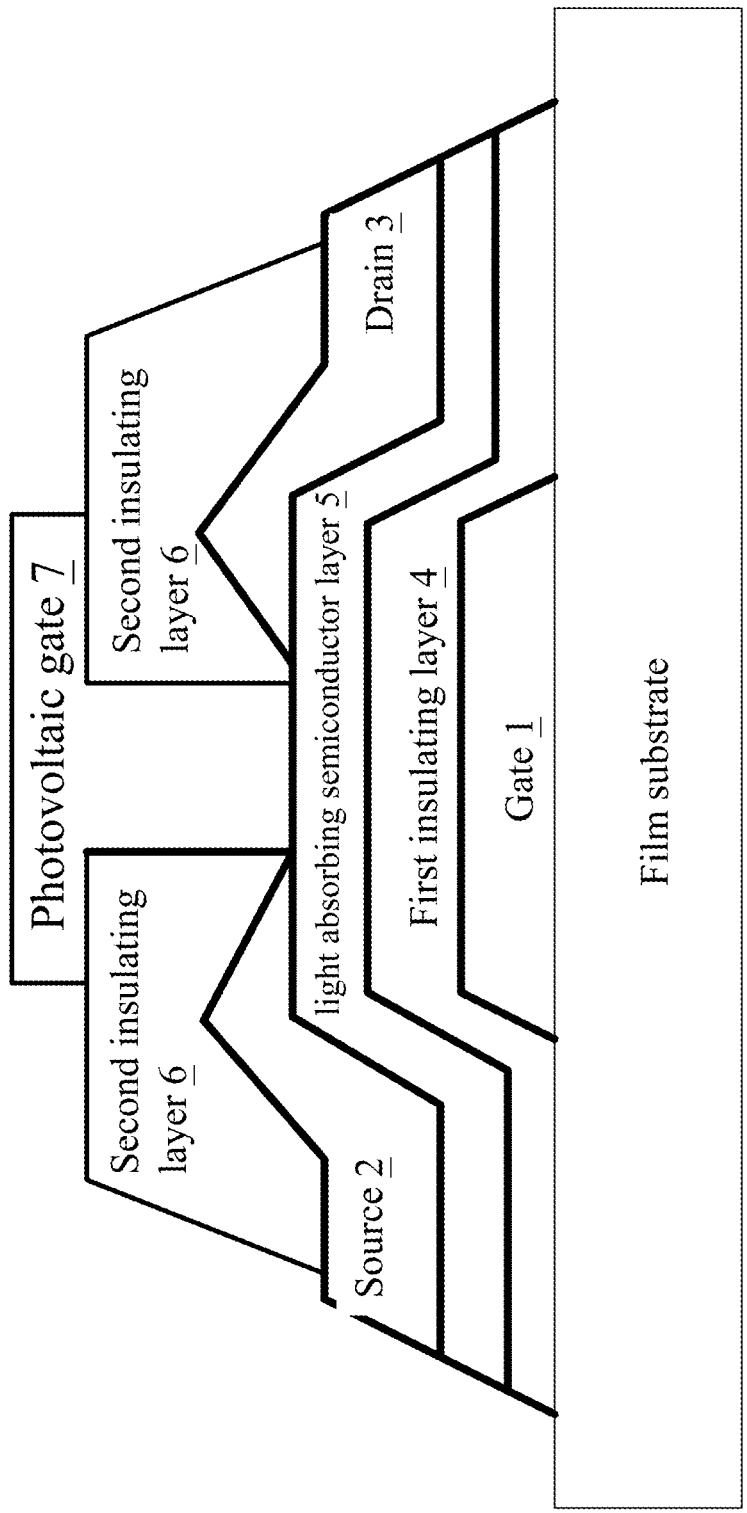
FIG. 3 is a structure diagram of TFT image sensing array film to an embodiment of the present disclosure.

In some embodiments, as shown in FIG. 3, the TFT image sensing array film is an array formed by the phototransistors. The array formed by the phototransistor includes a phototransistor sensing area. A photosensitive film transistor is disposed on the phototransistor sensing area. The photosensitive film transistor includes a gate 1, a source 2, a drain 3, an insulating layer 4, and a light absorbing semiconductor layer 5. The photosensitive film transistor has an inverted coplanar structure. The inverted coplanar structure includes the gate 1, the insulating layer 4, and the source 2 vertically arranged from bottom to top. The drain electrode 3 and the source electrode 2 are laterally coplanar. The insulating layer 4 includes the gate 1 so that there is no contact between the gate 1 and the source 2, the gate 1 and the drain 3. The source 2 and the drain 3 are isolated by a gap. A photosensitive leakage current channel is formed between source 2 and drain 3 laterally. The light absorbing semiconductor layer 5 is disposed in the photosensitive leakage current channel.

Generally, no current will flow between the source and the drain when the TFT is controlled by the gate voltage to operate in the off state. However, the electron-hole pair is excited by the energy of the light in the semiconductor when the TFT is irradiated by a light source. The field effect of the TFT structure will cause the electron-hole pair separation, so that a photosensitive leakage current is generated on the TFT. This photosensitive leakage current characteristic allows the TFT array to be applied to light detection or light detection technology. Compared with a general device that uses TFT leakage current as a photosensitive film transistor, is a light absorbing semiconductor layer on the uppermost light absorbing layer by the inverted coplanar field effect transistor structure in the present disclosure. That greatly increases the excitation of photoelectrons and improves the photoelectric conversion efficiency.

Figure 8:
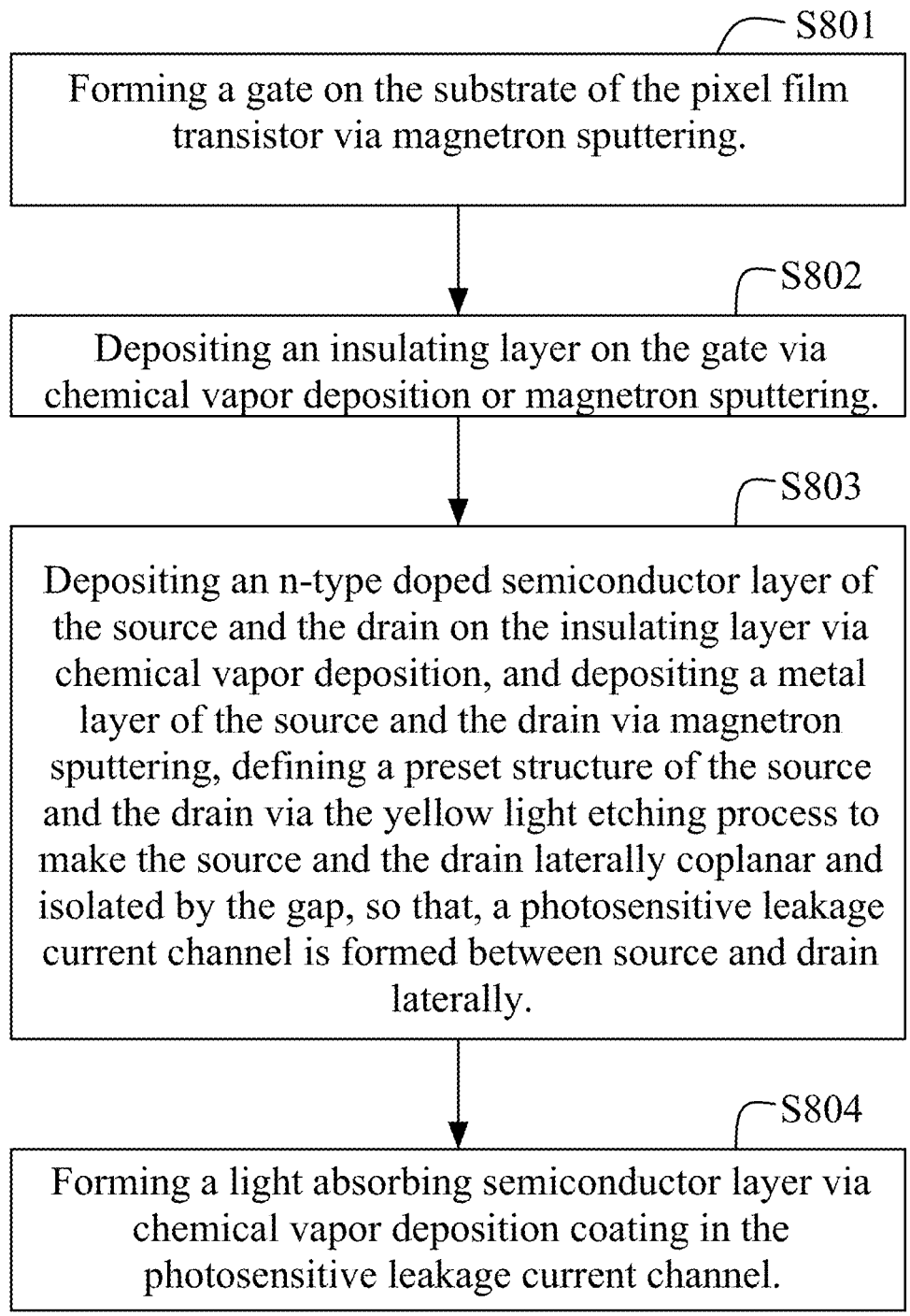
FIG. 8 is a flowchart of an embodiment of a method for preparing light detection film of the present disclosure.
Figure 9:
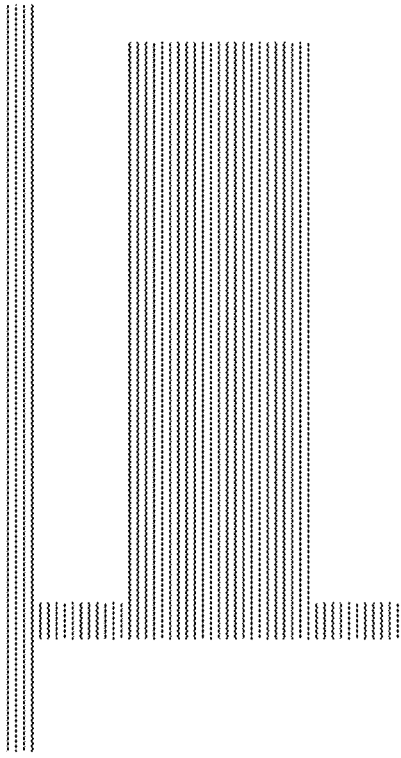
FIG. 9 is a schematic diagram during preparing light detection film of the present disclosure.
Figure 9:
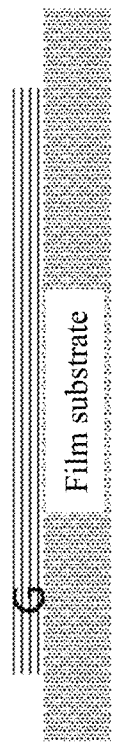
Figure 10:
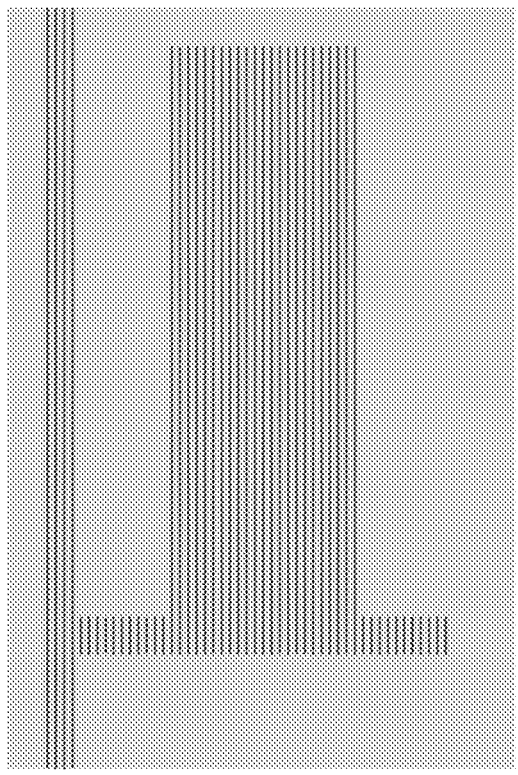
FIG. 10 is a schematic diagram during preparing light detection film of another embodiment of the present disclosure.
Figure 10:
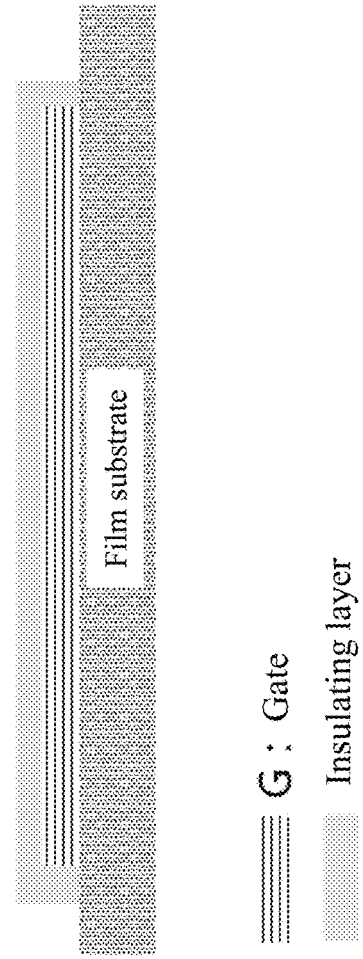
Figure 11:
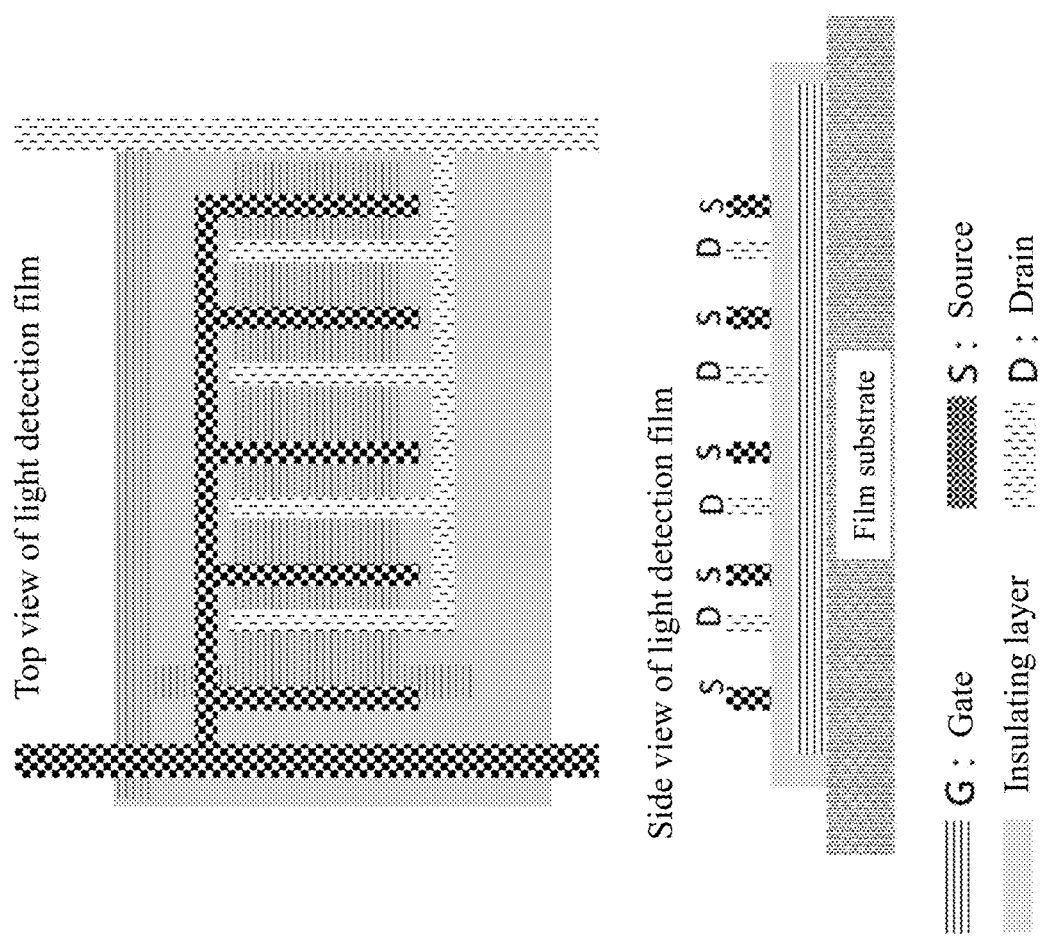
FIG. 11 is a schematic diagram during preparing light detection film of another embodiment of the present disclosure.
Figure 12:
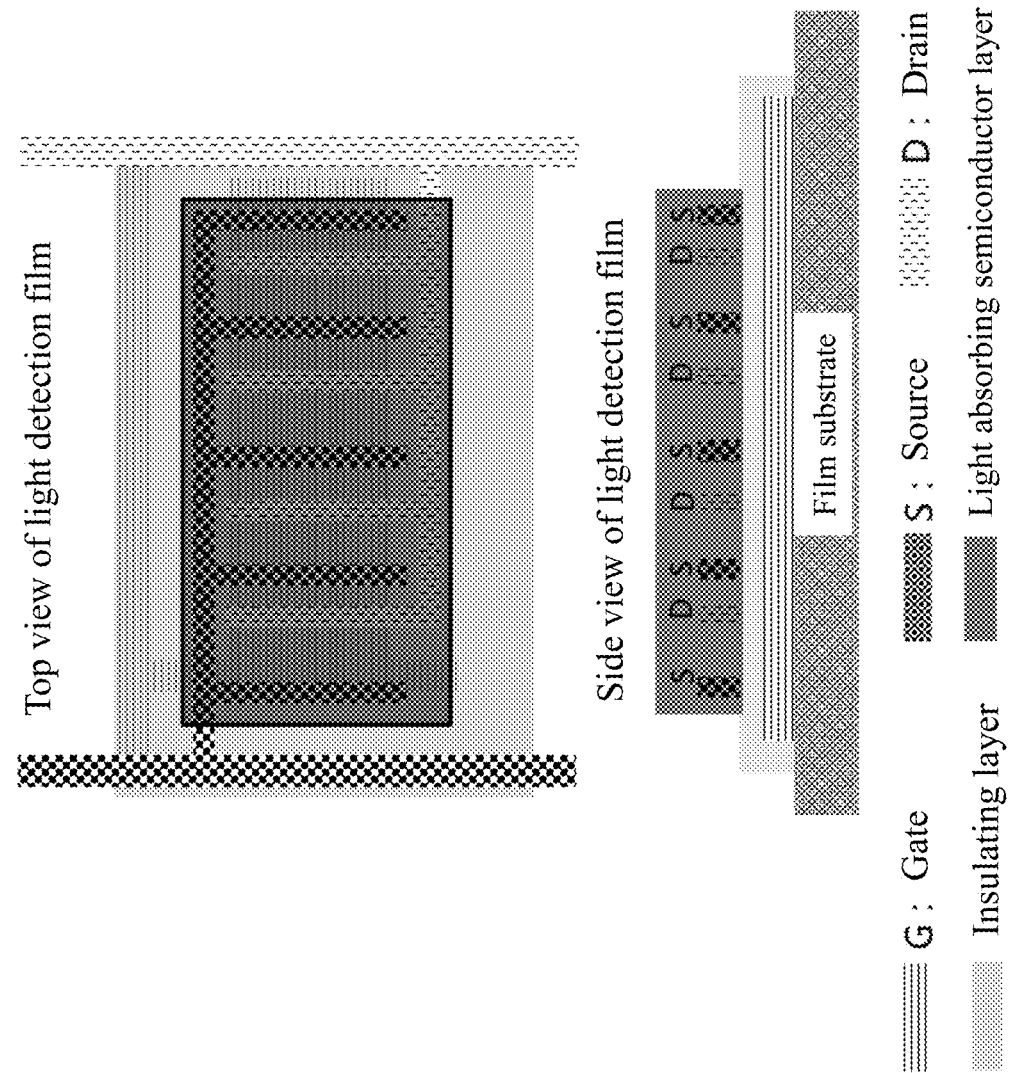
FIG. 12 is a schematic diagram during preparing light detection film of another embodiment of the present disclosure.

As shown in FIG. 8, it is a flowchart of an embodiment of a method for preparing light detection film of the present disclosure. The method is configured to prepare a photosensitive film transistor (i.e, a light detection film) of the sixth embodiment, and includes the following steps.

In a step S801, a gate is formed on the substrate of the pixel film transistor via magnetron sputtering. The substrate of the pixel film transistor can be a rigid board or a flexible material (such as polyimide) is executed In a step S802, an insulating layer is deposited on the gate via chemical vapor deposition or magnetron sputtering.

In a step S803, an n-type doped semiconductor layer of the source and the drain is deposited on the insulating layer via chemical vapor deposition, and a metal layer of the source and the drain is deposited via magnetron sputtering, a preset structure of the source and the drain is defined via the yellow light etching process to make the source and the drain laterally coplanar and isolated by a gap, so that, a photosensitive leakage current channel is formed between source and drain laterally.

In a step S804, a light absorbing semiconductor layer is formed via chemical vapor deposition coating in the photosensitive leakage current channel.

In some embodiments, in terms of the familiar field effect transistor structure, the TFTs as scan drive and data transfer switches do not need to be designed specifically for the structure that captures photocurrent between the source and drain. However, in the application of field effect transistor in the detection of photosensitive leakage current, if the electron-hole pair excited by light is separated by field effect, the drift path driven by the electric field is too long, it is very likely that the photoelectrons will recombine with the holes or trapped by the dangling bond defect of the light absorbing semiconductor layer itself before they successfully reach the electrode. Thus, photocurrent output cannot be effectively used for photodetection.

In order to improve the photosensitive leakage current affected by the channel length between the source and the drain, so as to increase the area of the light-absorbing semiconductor without deteriorating the photoelectric conversion efficiency. In this embodiment, the source and the drain of the fourth embodiment are further improved, and a new structure of the source and the drain is proposed.

Figure 4:
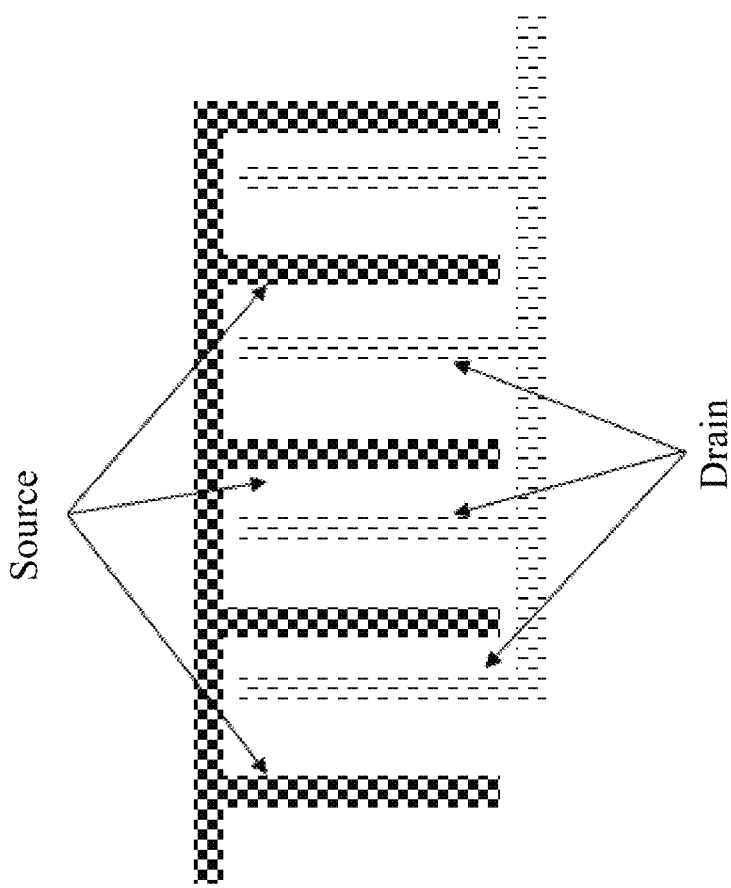
FIG. 4 is a schematic diagram of a structure match of source and drain to an embodiment of the present disclosure.

As shown in FIG. 4, the number of the source and drain are multiple. The sources are connected in parallel with each other, and the drain are connected in parallel with each other. The source and the drain are isolated by a gap. The photosensitive leakage current channel is formed between the source and drain laterally. The photosensitive leakage current channel includes a first gap formed between adjacent sources, a drain is placed in the first gap and a second gap formed between adjacent drains. The source and drain are arranged alternatively and isolated by a gap. The distance between each source and the adjacent drain is less than the electron drift distance. The electron drift distance is a distance that an electron can survive under a field effect. In this way, in each detection pixel, multiple sources belonging to the same pixel are connected in parallel to each other, and multiple drains belonging to the same pixel are also connected in parallel to each other. It can effectively reduce the probability of photo-excited electrons and holes recombining. The probability of the photoelectron being captured by the electrode under the field effect is improved, and the photosensitivity of the TFT leakage current photosensitive film transistor is improved maximumly.

As shown in FIGS. 9 to 12, in order to gradually prepare the process of the photosensitive film transistor (ie, the light detection film) of the seventh embodiment, the general steps are similar to the photosensitive film transistor of the sixth embodiment. The difference is that the "Define a preset structure of the source and drain via the yellow light etching process to capture source and drain laterally coplanar and isolated by a gap" of the step S803 includes a source group and a drain group are defined by a yellow light etching process when the source and the drain are prepared. Each source group includes multiple sources connected in parallel with each other. A first gap is formed between adjacent sources, a drain is placed in the first gap. A second gap is formed between adjacent drains, and a source is disposed in the second gap. The source and the drain are arranged alternatively and isolated by a gap.

In some embodiment, the receiving the light signal reflected by the user's body part and capturing the user's body part information includes: the sensing unit receives a detection trigger signal in a light detection state, and receives an light signal reflected from a user's body part to capture user's body part information. The light source trigger signal and the detection trigger signal alternately switches at a preset frequency. Taking the array formed by the sensing unit as a photodiode as an example, in the actual application process, the TFT can be used as a scanning to drive a bias voltage (including a forward bias voltage, a zero bias voltage or a negative bias voltage) between the p-type/i-type/n-type photodiode, so that function of TFT image sensing array film emitting infrared light can be achieved.

Specifically, a forward bias a zero bias or a negative bias may be applied between the p-type/i-type/n-type infrared photodiodes alternately to trigger the first trigger signal or the second trigger signal. Taking an array formed by infrared photodiodes with 10 pixel dots as an example, a forward bias is applied to the p-type/i-type/n-type infrared photodiodes during the first period, so that the 10-pixel pixel arrays are all emitting infrared light state. A zero or negative bias is applied to the p-type/i-type/n-type infrared photodiodes in the second period, so that the 10-pixel array is in the infrared light detection state, which is configured to capture the infrared light reflected by the user's eye information and generate corresponding infrared image output. In the third period, a forward bias is applied to the p-type/i-type/n-type infrared photodiodes, so that the 10-pixel pixel arrays are all in the state of emitting infrared light, alternating alternately, and so on. Further, the light source trigger signal (that is, the first trigger signal) and the detection trigger signal (that is, the second trigger signal) are alternately switched, and the switching frequency conforms to a preset frequency. The time interval between adjacent periods can be set according to actual needs.

In some embodiment, the time interval can be set to the time required for the infrared photodiode array to receive at least one complete image signal when the TFT array drives and scans each frame, that is, the preset frequency is switched once after the above time interval has passed.

Figure 6:
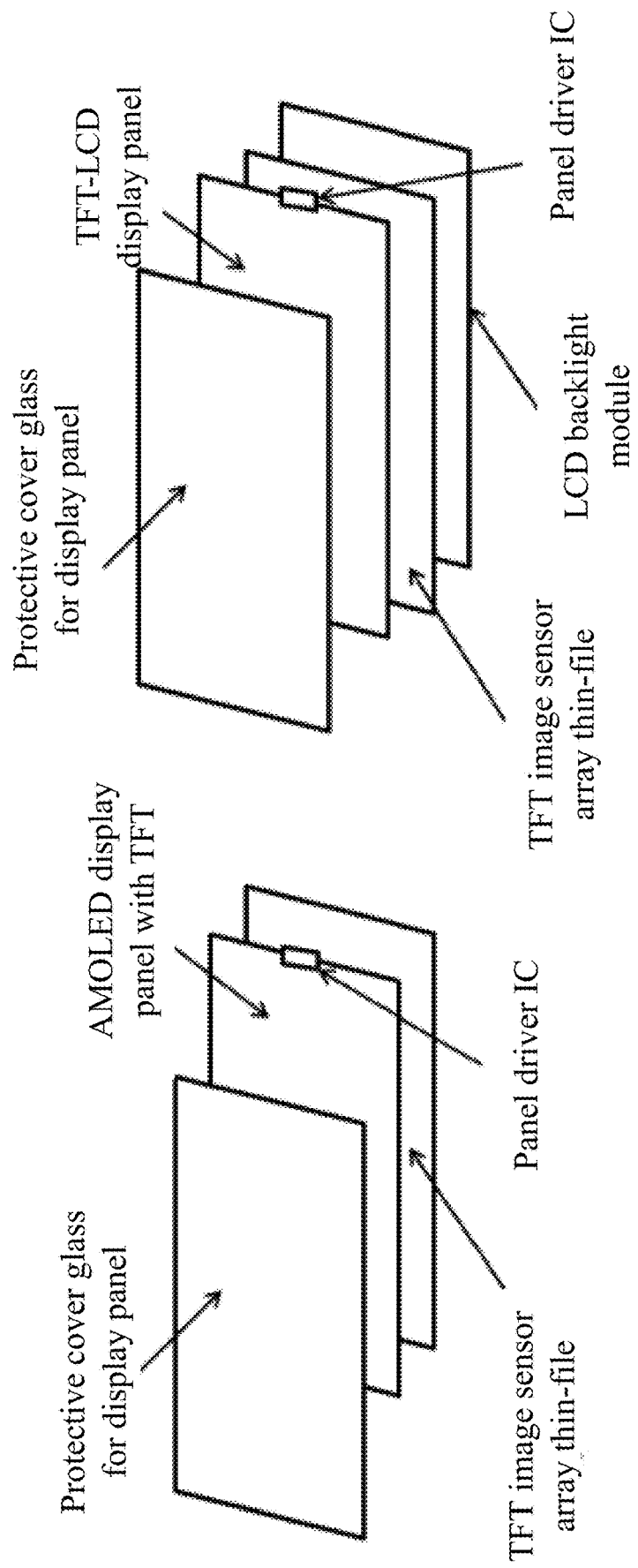
FIG. 6 is an application scenario of an electronic device according to an embodiment of the present disclosure.

As shown in FIG. 6, a backlight unit is further disposed below the sensing unit (ie, the TFT image sensing array film in FIG. 6) when the display unit is an LCD or an electronic ink display. The sensing unit is disposed between the backlight unit and the LCD display. Since the LCD is not a self-luminous element, a backlight unit needs to be added below the sensing unit during installation. The backlight unit may be an LCD backlight module or other electronic components with a self-light-emitting function. In other embodiments, the OLED display screen is a self-luminous element when the display unit is an AMOLED display screen so there is no need to provide a backlight unit. The settings of the above two schemes can effectively meet the production needs of different manufacturers and increase the scope of application of the terminal.

In some embodiments, the fingerprint recognition area includes a plurality of fingerprint recognition sub-area, and a sensing unit is correspondingly disposed below each fingerprint recognition sub-area. The device further includes a sensing unit control circuit 112 and a command receiving unit 113. The method further includes: the sensing unit control circuit 112 turns on the sensing unit below the fingerprint recognition sub-area after the command receiving unit 113 receives a start command of the fingerprint recognition sub-area, and the sensing unit control circuit 112 turns off the sensing unit below the fingerprint recognition sub-area after the command receiving unit 113 receives a close command of the fingerprint recognition sub-area.

Taking the number of fingerprint recognition sub-regions as two as an example, the two fingerprint recognition sub-area can be evenly distributed on the screen one by one or one left or right, or they can be distributed on the screen in other arrangements. The application process of a terminal with two fingerprint recognition sub-regions is specifically described below: a user-initiated activation signal is received during using, and the light detection devices (that is, the sensing unit) under the two fingerprint recognition sub sub-area are set to the on state. In some embodiment, the range formed by the two fingerprint recognition sub-areas covers the entire display screen. It can ensure that when the light detection devices under the two fingerprint recognition sub-areas are set to the on state. The light signal can be absorbed by the TFT image sensing array film (ie, the sensing unit) below to capture the user's fingerprint or body information. Of course, according to the user's preferences, the user can turn on the light detection device under a certain fingerprint recognition sub-region and turn off the light detection device under another fingerprint recognition sub-region.

Figure 5:
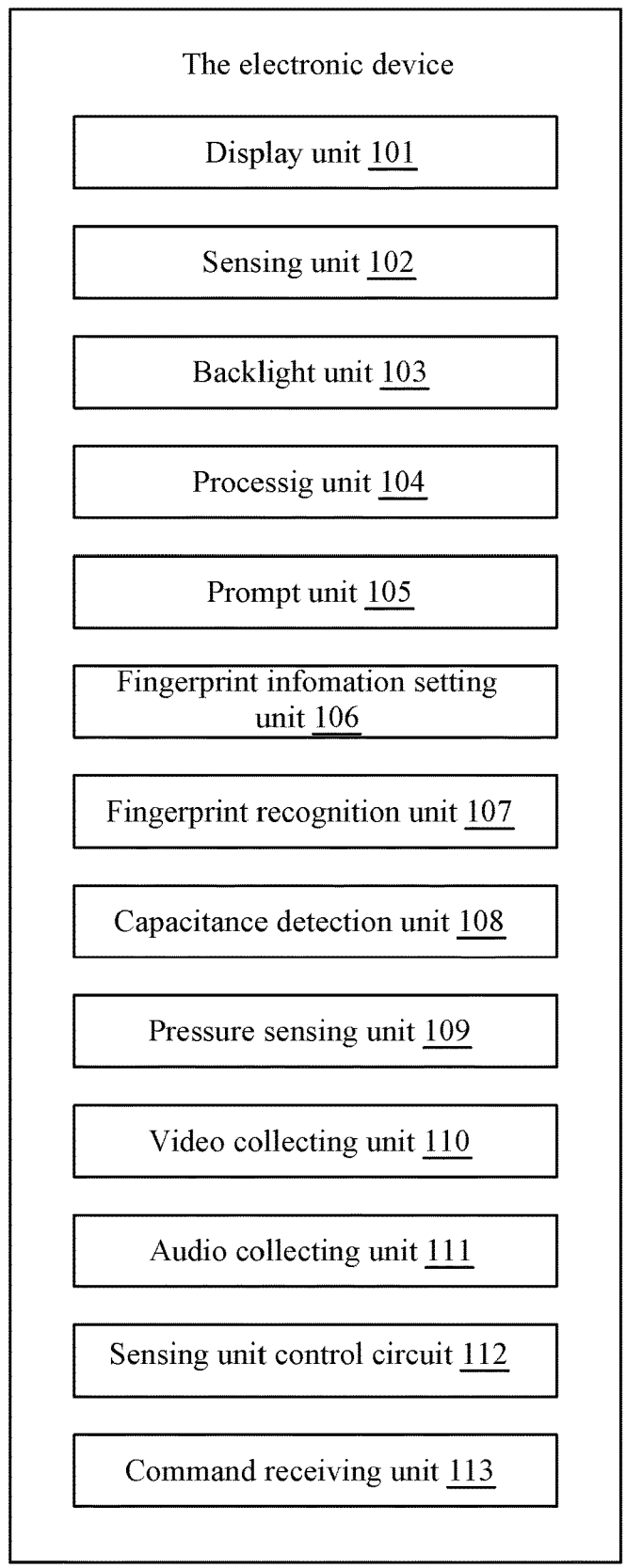
FIG. 5 is a schematic diagram of an electronic device according to an embodiment of the present disclosure.

As shown in FIG. 5, it is a schematic diagram of an electronic device according to an embodiment of the present disclosure. The electronic device includes a display unit 101 and a sensing unit 102. The display unit 101 is provided with a fingerprint recognition area and the sensing unit 102 is provided below the fingerprint recognition area. The electronic device further includes a fingerprint information setting unit 106, a fingerprint recognition unit 107, and a processing unit 104.

The fingerprint information setting unit 106 is configured to preset the correspondence between the operation command and the preset fingerprint information. The preset fingerprint information includes preset fingerprint information of at least two fingers of the user.

The sensing unit 102 is configured to capture fingerprint information placed on the fingerprint recognition area. When the synchronously captured fingerprint information includes fingerprint information of at least two fingers, the fingerprint recognition unit 107 is used to compare the synchronously captured fingerprint information with preset fingerprint information. If they are matched, the processing unit 104 is used to execute the operation command corresponding to the preset fingerprint information, otherwise, the processing unit 104 does not execute the operation command corresponding to the preset fingerprint information.

In some embodiment, the electronic device includes a capacitance detection unit 108 and a pressure sensing unit 109. The pressure sensing unit 109 may be disposed between the display unit 101 and the sensing unit 102. The capacitance detection unit 108 is configured to detect the capacitance change value per unit time on the pressure sensing unit 109. The capacitance detection unit 108 may be integrated with the pressure sensing unit 109. When the captured fingerprint information simultaneously includes fingerprint information of at least two fingers, the processing unit 104 is configured to determine whether the capacitance change value of the pressing sensing unit is higher than the preset capacitance change value. If it is yes, the fingerprint recognition unit 107 is configured to match the synchronously captured fingerprint information with the preset fingerprint information, otherwise the fingerprint recognition unit does not perform the matching operation. By detecting the change value of the pressure sensing unit in a unit time, the accuracy of the emergency determination can be effectively improved, and the user's maloperation can be avoided.

In some embodiment, the electronic device includes a prompt unit 105. The prompt unit 105 the prompting unit is configured to generate prompt message when the fingerprint recognition unit determines that the synchronously captured fingerprint information is not matched with the preset fingerprint information. The prompt message includes one or more of sound prompt message, image prompt message, light prompt message, video prompt message, and vibration prompt message. The prompt message is configured to inform the user whether the current fingerprint information is successfully matched, so that the user can be informed in time and enter the fingerprint again when the fingerprint information does not match.

In some embodiment, the display unit is a screen using the active array film transistor as scan driving and data transmission. The screen includes an AMOLED display, a LCD display, a micro-LED display, quantum dot display, or an electronic ink display.

As shown in FIG. 6, in some embodiments, a backlight unit 103 disposed below the sensing unit, the sensing unit is disposed between the LCD display and the backlight unit when the display unit is the LCD display or the electronic ink display. Since the LCD is not a self-luminous element, a backlight unit needs to be added below the sensing unit during installation. The backlight unit may be an LCD backlight module or other electronic components with a self-light-emitting function. In other embodiments, there is no need to provide a backlight unit when the display unit is an AMOLED display screen, since the OLED display screen is a self-luminous element. The settings of the above two schemes can effectively meet the production needs of different manufacturers and increase the scope of application of the terminal.

In some embodiment, the electronic device includes a video capturing unit 110 that is configured to capture video streaming data, and the emergency service short message includes video streaming data captured by the video capturing unit 110. In this way, after receiving the emergency service short message, some of the current user needs or situation can be further understood through the video streaming data, so as to take more targeted rescue measures to rescue.

In order to enable the emergency service end to receive the emergency service short message sent by the electronic device more quickly, in other embodiment the electronic device includes an audio capturing unit 111. The audio capturing unit is configured to capturing audio streaming data. The emergency service short message includes the audio streaming data captured by the audio capturing unit 111. Compared with video streaming data, audio streaming data has advantages of lower bandwidth and faster transmission speed. After the audio information carried by the emergency server is received, it can feedback the current emergency situation. For example, the audio streaming data is a general description of the current emergency situation encountered by the user, and the emergency server can take more targeted rescue measures to rescue.

Therefore, the present disclosure has following advantages. By setting a fingerprint recognition area on the display unit and a sensing unit below the fingerprint recognition area, the sensing unit can capture the user's fingerprint information when the user just places his finger on the fingerprint recognition area. When the fingerprint information captured at the same time includes fingerprint information of at least two fingers, it means that the user touches the fingerprint recognition area with at least two fingers at this time, it is likely that an emergency occurs. At this time, the fingerprint recognition unit is matched with the synchronously captured fingerprint information with the preset fingerprint information, and after the matching is successful, the processing unit executes a corresponding operation command, such as triggering an alarm call or sending a help message. Compared with the traditional way in which mobile devices additionally provide sensors outside the display screen area, the electronic device of the present disclosure facilitates user operations on the one hand and makes the process of sending out a emergency message more conveniently, efficiently and secretly on the other hand, effectively reducing the overall thickness of mobile devices, making mobile devices thinner and lighter to meet market demand.

It should be noted that, in this context, relationship terms such as first and second are used merely to distinguish one entity or operation from another entity or operation, and do not necessarily require or imply any such actual relationship or order between those entities or operations. Furthermore, the terms "include/comprise" or "contain" or any other variations are intended to encompass a non-exclusive inclusion, such that a process, method, object, or terminal device that includes a plurality of elements includes not only those elements but also other elements not explicitly listed, or includes elements inherent to such a process, method, object, or terminal device. Without further limitation, the elements defined by the sentence "including/comprising . . . " or "containing . . . " do not exclude the existence of additional elements in the process, method, object or terminal device including the elements. In addition, in this context, "greater than", "less than", "exceeds", etc. shall be construed to exclude the figure; and "above", "below", "inside", etc. shall be construed to include the figure.

Those skilled in the art shall understand that the various embodiments described above can be provided as a method, a device, or a computer program product. These embodiments may take the form of an entirely hardware embodiment, an entirely software embodiment, or a combination of software and hardware aspects. All or part of the steps in the method involved in the foregoing embodiments may be completed by instructing relevant hardware by a program, and the program may be stored in a storage medium readable by a computer device for executing all or part of the steps in the method of the foregoing embodiments. The computer device includes, but is not limited to, a personal computer, a server, a general purpose computer, a special purpose computer, a network device, an embedded device, a programmable device, a smart mobile terminal, a smart household device, a wearable smart device, a vehicle-mounted smart device, etc. The storage medium includes, but is not limited to, a RAM, a ROM, a magnetic disk, a magnetic tape, an optical disk, a flash memory, a USB flash drive, a mobile hard disk, a memory card, a memory stick, a network server storage, a network cloud storage, etc.

The above embodiments are described with reference to process flow diagrams and/or block diagrams of methods, devices (systems), and computer program products according to the embodiments. It shall be understood that each process and/or block in the process flow diagram and/or block diagram and the combination of process and/or block in the process flow diagram and/or block diagram can be realized by computer program instructions. These computer program instructions can be provided to a processor of a computer device to produce a device, such that when the instructions executed by the processor of the computer device, a device for implementing the functions specified in one or more processes in a process flow diagram and/or one or more blocks in a block diagram is produced.

These computer program instructions can also be stored in a computer device readable memory that can direct guide the computer device to operate in a particular manner, thereby enabling the instructions stored in the computer device readable memory to produce a manufacture including an instruction device, and the instruction device implements the functions specified in one or more processes in a process flow diagram and/or one or more blocks in a block diagram.

These computer program instructions can also be loaded onto a computer device, enabling a series of operating steps to be executed on the computer device to produce computer-implemented processing, and thus the instructions executed on the computer device provide steps for implementing the functions specified in one or more processes in a process flow diagram and/or one or more blocks in a block diagram.

Although the above embodiments have been described, those skilled in the art can make other changes and modifications to these embodiments once they have learned the basic inventive concept. Therefore, the above descriptions are only the embodiments of the present invention, and thus does not limit the patent protective scope of the present invention. Similarly, any equivalent structure or equivalent process transformation made by using the present specification and the drawings, or directly or indirectly applied to other relevant technical fields, shall be included in the patent protective scope of the present invention.

I claim:

1. An electronic device, comprising a display unit, a sensing unit, a fingerprint information setting unit, a fingerprint recognition unit, and a processing unit, the display unit comprising a fingerprint recognition area;
   wherein the fingerprint information setting unit is configured to preset a correspondence between an operation command and a preset fingerprint information, the preset fingerprint information comprises preset fingerprint information of at least two fingers of a user;
   wherein the sensing unit is configured to capture fingerprint information as a captured fingerprint information within the fingerprint recognition area, the fingerprint recognition unit is configured to compare the captured fingerprint information with preset fingerprint information, if the captured fingerprint information is matched with the preset fingerprint information, the processing unit is configured to execute the operation command corresponding to the preset fingerprint information, otherwise the processing unit does not execute the operation command corresponding to the preset fingerprint information;
   wherein the fingerprint recognition unit being configured to compare the captured fingerprint information with the preset fingerprint information comprises:
   the fingerprint recognition unit being configured to calculate its feature value based on the captured fingerprint information and compare the feature value with a feature value of the preset fingerprint information;
   when an error between the two feature values is less than a preset error value, it is determined that the captured fingerprint information is matched with the preset fingerprint information;
   otherwise, it is determined that the captured fingerprint information fails to match the preset fingerprint information.

2. The electronic device according to claim 1, wherein the sensing unit is configured to synchronously capture fingerprint information of multiple fingers within the fingerprint recognition area, the fingerprint recognition unit is configured to compare the synchronously captured fingerprint information with the preset fingerprint information.

3. The electronic device according to claim 2, wherein the electronic device comprises a capacitance detection unit and a pressure sensing unit;
   wherein the capacitance detection unit is configured to detect a capacitance change value per unit time on the pressure sensing unit;
   wherein the processing unit is configured to determine whether the capacitance change value of the pressing sensing unit is higher than a preset capacitance change value, if yes, the fingerprint recognition unit is configured to match the fingerprint information captured synchronously with the preset fingerprint information, otherwise the fingerprint recognition unit does not implement the matching operation.

4. The electronic device according to claim 2, wherein the fingerprint recognition unit being configured to compare the synchronously captured fingerprint information with the preset fingerprint information comprises:
   the fingerprint recognition unit being configured to determine whether each synchronously captured fingerprint information by the sensing unit is matched with a fingerprint information in the preset fingerprint information, if yes, it is determined that the synchronously captured fingerprint information is matched with the preset fingerprint information, otherwise it is determined that it does not match.

5. The electronic device according to claim 1, wherein the operation command comprises calling an emergency service terminal or sending an emergency service short message to the emergency service terminal.

6. The electronic device according to claim 5, wherein the electronic device comprises a video capturing unit, the video capturing unit is configured to capture video streaming data, and the emergency service short message comprises video streaming data captured by the video capturing unit.

7. The electronic device according to claim 5, wherein the electronic device comprises an audio capturing unit, the audio capturing unit is configured to capture audio streaming data, and the emergency service short message comprises the audio streaming data captured by the audio capturing unit.

8. The electronic device according to claim 1, wherein the sensing unit is configured to emit a light signal and receive the light signal reflected by the user's body so as to capture the user's body information when receiving a light source trigger signal;
   wherein the processing unit is configured to capture physiological information of the body according to the light signal reflected by the body and determine whether the physiological information is greater than a corresponding preset physiological value;
   if yes, the processing unit is configured to execute the operation command corresponding to the preset fingerprint information, otherwise the processing unit does not execute the operation command corresponding to the preset fingerprint information.

9. The electronic device according to claim 8, wherein the sensing unit being configured to receive the light signal reflected by the user's body part and capturing the user's body part information comprises:
   the sensing unit being configured to be in a light detection state and receive a light signal reflected from the user's body part to capture the user's body part information when receiving a detection trigger signal;
   wherein the light source trigger signal and the detection trigger signal alternately switch at a preset frequency.

10. The electronic device according to claim 1, wherein the fingerprint recognition area comprises a plurality of fingerprint recognition sub-area, and a sensing unit is correspondingly disposed below each fingerprint recognition sub-area.

11. The electronic device according to claim 10, wherein the electronic device further comprises a sensing unit control circuit; the sensing unit control circuit is configured to turn on the sensing unit below the fingerprint recognition sub-area when the electronic device receives a start command of the fingerprint recognition sub-area, and the sensing unit control circuit is configured to turn off the sensing unit below the fingerprint recognition sub-area when the electronic device receives a close command of the fingerprint recognition sub-area.

12. The electronic device according to claim 1, wherein the sensing unit comprises a TFT image sensing array comprising an array formed by photodiodes or phototransistors;
   a detection wavelength range of the array formed by the photodiodes or phototransistors covers visible spectrum or infrared spectrum.

13. The electronic device according to claim 12, wherein the TFT image sensing array is an array formed by photodiodes, and the array formed by photodiodes comprises a photosensitive diode region comprising a photodiode layer;
   wherein the photodiode layer comprises at least two sandwich structures, each sandwich structure comprises a p-type semiconductor layer, an i-type semiconductor layer and an n-type semiconductor layer;
   wherein the i-type semiconductor layer is a microcrystalline silicon structure or an amorphous germanium silicide structure.

14. The electronic device according to claim 13, wherein the microcrystalline silicon structure is a semiconductor layer formed by silane and hydrogen via chemical vapor deposition;
   a crystallinity of the microcrystalline silicon structure is higher than 40%, and a band gap of the microcrystalline silicon structure is less than 1.7 eV.

15. The electronic device according to claim 13, wherein the amorphous germanium silicide structure is an amorphous semiconductor layer formed by silane, hydrogen, and germane via chemical vapor deposition; a band gap of the amorphous semiconductor layer is less than 1.7 eV.

16. The electronic device according to claim 13, wherein a first optical element is disposed on a top surface of the p-type semiconductor layer and configured to reduce reflectivity of light on the top surface of the p-type semiconductor layer or reduce a refraction angle of light in the p-type semiconductor to increase an amount of light incident.

17. The electronic device according to claim 13, wherein a second optical element is disposed on a bottom surface of the n-type semiconductor layer and configured to increase reflectivity of light on the bottom surface of the n-type semiconductor layer.

18. The electronic device according to claim 12, wherein the TFT image sensing array film is an array formed by the phototransistors, and the array formed by the phototransistors comprises a phototransistor sensing area;
   a photosensitive film transistor is disposed on the phototransistor sensing area and comprises a gate, a source, a drain, an insulating layer, and a light absorbing semiconductor layer;
   the photosensitive film transistor has an inverted coplanar structure comprising the gate, the insulating layer, and the source vertically arranged from bottom to top;

the drain and the source are laterally coplanar;

the insulating layer surrounds the gate so that there is no contact between the gate and the source, the gate and the drain;

the source and the drain are isolated by a gap, and a photosensitive leakage current channel is formed between source and drain laterally; and the light absorbing semiconductor layer is disposed in the photosensitive leakage current channel.

19. The electronic device according to claim 18, wherein there are multiple sources and drains; the sources are connected in parallel with each other, and the drain are connected in parallel with each other;

the source and the drain are isolated by a gap;

the photosensitive leakage current channel being formed between the source and drain laterally comprises:

a first gap being formed between adjacent sources;

a drain being placed in the first gap;

a second gap formed between adjacent drains;

a source being formed in the second gap; and the sources and drains are arranged alternately.

\* \* \* \* \*